(12) United States Patent
Chung et al.

(10) Patent No.: US 9,245,771 B2
(45) Date of Patent: Jan. 26, 2016

(54) SEMICONDUCTOR PACKAGES HAVING THROUGH ELECTRODES AND METHODS FOR FABRICATING THE SAME

(71) Applicant: SAMSUNG ELECTRONICS CO., LTD., Gyeonggi-do (KR)

(72) Inventors: Hyunsoo Chung, Hwaseong-si (KR); Keum-Hee Ma, Suwon-si (KR); In-Young Lee, Yongin-si (KR); Moon Gi Cho, Suwon-si (KR); Chajea Jo, Bucheon-si (KR); Taeje Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/264,120

(22) Filed: Apr. 29, 2014

(65) Prior Publication Data

US 2014/0377909 A1    Dec. 25, 2014

(30) Foreign Application Priority Data

Jun. 21, 2013    (KR) .................. 10-2013-0071775

(51) Int. Cl.
*H01L 21/56* (2006.01)
*H01L 23/31* (2006.01)
(Continued)

(52) U.S. Cl.
CPC .......... *H01L 21/561* (2013.01); *H01L 21/6836* (2013.01); *H01L 23/3135* (2013.01); *H01L 24/92* (2013.01); *H01L 24/94* (2013.01); *H01L 24/97* (2013.01); *H01L 25/03* (2013.01); *H01L 25/0657* (2013.01); *H01L 25/50* (2013.01); *H01L 24/03* (2013.01); *H01L 24/05* (2013.01); *H01L 24/11* (2013.01); *H01L 24/13* (2013.01); *H01L 24/81* (2013.01); *H01L 2221/6834* (2013.01); *H01L 2221/68327* (2013.01); *H01L 2224/0345* (2013.01); *H01L 2224/03462* (2013.01); *H01L 2224/0401* (2013.01); *H01L 2224/05009* (2013.01); *H01L 2224/0557* (2013.01); *H01L 2224/05568* (2013.01); *H01L 2224/119* (2013.01);
(Continued)

(58) Field of Classification Search
CPC ........................... H01L 12/006; H01L 21/561
See application file for complete search history.

(56) References Cited

U.S. PATENT DOCUMENTS

| 7,413,925 B2 | 8/2008 | Egawa |
| 7,948,095 B2 | 5/2011 | Ng et al. |

(Continued)

FOREIGN PATENT DOCUMENTS

| JP | 2001-15535 A | 1/2001 |
| JP | 2012-209545 A | 10/2012 |

(Continued)

*Primary Examiner* — Kyoung Lee
(74) *Attorney, Agent, or Firm* — Sughrue Mion, PLLC

(57) ABSTRACT

Semiconductor packages having through electrodes and methods for fabricating the same are provided. The method may comprise providing a first substrate including a first circuit layer, forming a front mold layer on a front surface of the first substrate, grinding a back surface of the first substrate, forming a first through electrode that penetrates the first substrate to be electrically connected to the first circuit layer, providing a second substrate on the back surface of the first substrate, the second substrate including a second circuit layer that is electrically connected to the first through electrode, forming a back mold layer on the back surface of the first substrate, the back mold layer encapsulating the second substrate, and removing the front mold layer.

30 Claims, 20 Drawing Sheets

(51) Int. Cl.
*H01L 23/00* (2006.01)
*H01L 25/03* (2006.01)
*H01L 25/065* (2006.01)
*H01L 25/00* (2006.01)
*H01L 21/683* (2006.01)

(52) U.S. Cl.
CPC ........... *H01L 2224/11462* (2013.01); *H01L 2224/11464* (2013.01); *H01L 2224/13017* (2013.01); *H01L 2224/13022* (2013.01); *H01L 2224/13082* (2013.01); *H01L 2224/16146* (2013.01); *H01L 2224/16148* (2013.01); *H01L 2224/16225* (2013.01); *H01L 2224/17051* (2013.01); *H01L 2224/17181* (2013.01); *H01L 2224/32145* (2013.01); *H01L 2224/4824* (2013.01); *H01L 2224/73204* (2013.01); *H01L 2224/73257* (2013.01); *H01L 2224/81005* (2013.01); *H01L 2224/81007* (2013.01); *H01L 2224/92* (2013.01); *H01L 2224/92227* (2013.01); *H01L 2224/94* (2013.01); *H01L 2224/97* (2013.01); *H01L 2225/0651* (2013.01); *H01L 2225/06513* (2013.01); *H01L 2225/06541* (2013.01); *H01L 2225/06568* (2013.01); *H01L 2924/18161* (2013.01)

(56) References Cited

U.S. PATENT DOCUMENTS

| | | | |
|---|---|---|---|
| 8,143,097 | B2 | 3/2012 | Chi et al. |
| 8,293,580 | B2 | 10/2012 | Kim et al. |
| 8,338,939 | B2 | 12/2012 | Lin et al. |
| 8,373,261 | B2 | 2/2013 | Kim et al. |
| 2003/0166380 | A1* | 9/2003 | Shibuki .................. 451/41 |
| 2004/0188819 | A1* | 9/2004 | Farnworth et al. ........... 257/686 |
| 2007/0184583 | A1 | 8/2007 | Egawa |
| 2009/0200662 | A1 | 8/2009 | Ng et al. |
| 2010/0225002 | A1 | 9/2010 | Law et al. |
| 2010/0244233 | A1 | 9/2010 | Kim et al. |
| 2010/0244241 | A1 | 9/2010 | Marimuthu et al. |
| 2011/0068444 | A1 | 3/2011 | Chi et al. |
| 2011/0237027 | A1 | 9/2011 | Kim et al. |
| 2012/0007154 | A1 | 1/2012 | Lin et al. |
| 2012/0119346 | A1 | 5/2012 | Im et al. |
| 2012/0282735 | A1 | 11/2012 | Ahn et al. |
| 2013/0037935 | A1 | 2/2013 | Xue et al. |

FOREIGN PATENT DOCUMENTS

| | | |
|---|---|---|
| KR | 10-2011-0105159 A | 9/2011 |
| KR | 10-2012-0045402 A | 5/2012 |

* cited by examiner

SEMICONDUCTOR PACKAGES HAVING THROUGH ELECTRODES AND METHODS FOR FABRICATING THE SAME

CROSS-REFERENCE TO RELATED APPLICATIONS

This U.S. nonprovisional patent application claims benefit under 35 U.S.C. §119 of Korean Patent Application 10-2013-0071775 filed on Jun. 21, 2013, the entire contents of which are hereby incorporated by reference.

BACKGROUND

The present inventive concept relates to semiconductor and, more particularly, to semiconductor packages having through electrodes and methods for fabricating the same.

Through electrodes allow for accomplishing high performance semiconductor packages. Application of the through electrode to the semiconductor package generally results in grinding a wafer to which a carrier is bonded with an adhesive layer interposed between the carrier and wafer. Because the carrier process is needed for having through electrodes to the semiconductor packages, there are problems such as decrease of productivity and increase of cost.

SUMMARY

Therefore, its is an aspect of an example embodiment to provide a method of making a semiconductor device, the method including: providing a substrate including a first active layer on a front surface of a wafer; and forming a first mold layer on the first active layer to provide rigidity to the substrate, the first mold layer including a polymer material; thinning the substrate by removing a first back surface of the substrate after forming the first mold layer, to expose a second back surface, the substrate being held in place during the thinning by removably attaching the first mold layer to a device without using an adhesive; and forming pads on the thinned substrate, the pads being electrically connected to through electrodes in the substrate.

The device may be removably attached to the first mold layer without bonding the device to the first mold layer.

The device may be removably attached to the first mold layer without using an adhesive between the device and the first mold layer.

The thinning the first back surface of the substrate may include removing the first back surface using a mechanical process.

The thinning the first back surface of the substrate may include grinding the first back surface of the substrate.

In an example embodiment, the method may further include forming the through electrodes in the thinned substrate.

In another example embodiment, the method may further include stacking a chip on the second back surface of the thinned substrate, an active layer of the chip facing the second back surface of the thinned substrate.

In yet another example embodiment, the method may further include: forming a second mold layer on the chip to encapsulate the chip to provide rigidity to the substrate; and removing at least a portion of the first mold layer after forming the second mold layer to form a smooth planar surface.

In one example embodiment the method further includes: cutting the first and the second mold layers and the substrate to form a semiconductor package so that any one of a width of the first mold layer of the semiconductor package and a width of the second mold layer of the semiconductor package, and a width of the substrate of the semiconductor package is substantially greater than a width of the chip.

The width of the first mold layer of the semiconductor package, the width of the second mold layer of the semiconductor package, and the width of the substrate of the semiconductor package may be substantially same.

The second mold layer may not be disposed between the chip and the substrate.

In the thinning the substrate, the device may be a vacuum chuck which directly holds and is in direct contact with the first mold layer.

In the removing at least a portion of the first mold layer, the second mold layer may be directly held by and may be in direct contact with a vacuum chuck.

A coefficient of thermal expansion (CTE) of the first mold layer and a CTE of the substrate may be within an order of magnitude.

A ratio of the coefficient of thermal expansion (CTE) of the first mold layer and a CTE of the substrate may be in a range from 3 to 1.

The first active layer may be a circuit layer.

In an example embodiment, there is a method of making a semiconductor device, the method including: providing a substrate including a first active layer on a front surface of the wafer; and forming a first mold layer on the first active layer to provide rigidity to the substrate, the first mold layer including a polymer material; thinning the substrate by removing a first back surface of the substrate after forming the first mold layer, to expose a second back surface; forming through electrodes in the thinned substrate, the through electrodes being electrically connected to the first active layer; and forming pads on the thinned substrate, the pads being electrically connected to the through electrodes in the substrate.

The device may be removably attached to the first mold layer without bonding the device to the first mold layer.

The device may be removably attached to the first mold layer without using an adhesive between the device and the first mold layer.

The thinning the first back surface of the substrate may include removing the first back surface using a mechanical process.

The thinning the first back surface of the substrate may include grinding the first back surface of the substrate.

In an example embodiment, the method may further include: stacking a chip on the second back surface of the thinned substrate, an active layer of the chip facing the second back surface of the thinned substrate.

In another example embodiment, the method further includes: forming a second mold layer on the chip to encapsulate the chip to provide rigidity to the substrate; and removing at least a portion of the first mold layer after forming the second mold layer to form a smooth planar surface.

In yet another example embodiment the method further includes: cutting the first and the second mold layers and the substrate to form a semiconductor package so that any one of a width of the first mold layer of the semiconductor package and a width of the second mold layer of the semiconductor package, and a width of the substrate of the semiconductor package is substantially greater than a width of the chip.

The width of the first mold layer of the semiconductor package, the width of the second mold layer of the semiconductor package, and the width of the substrate of the semiconductor package may be substantially same.

The second mold layer may not be disposed between the chip and the substrate.

In the thinning the substrate, the device may be a vacuum chuck which directly holds and may be in direct contact with the first mold layer.

In the removing at least a portion of the first mold layer, the second mold layer may be directly held by and may be in direct contact with a vacuum chuck.

A coefficient of thermal expansion (CTE) of the first mold layer and a CTE of the substrate may be within an order of magnitude.

A ratio of the coefficient of thermal expansion (CTE) of the first mold layer and a CTE of the substrate may be in a range from 3 to 1.

In an example embodiment, there is a semiconductor device including: a first mold layer including a first polymer material; a first active layer disposed on the first mold layer; a substrate disposed on the first active layer, the substrate having through electrodes formed therein, the through electrodes electrically connected to the first active layer; pads formed on the substrate and electrically connected to the through electrodes; a chip disposed above the substrate, a second active layer of the chip facing the substrate and electrically connected to the pads; and a second mold layer covering at least a portion of the chip, the second mold layer providing rigidity to the substrate and including a second polymer material; wherein a width of the substrate is greater than a width of the chip.

The chip may be encapsulated by the second mold layer.

Sidewalls of the substrate and sidewalls of the first active layer may not be covered by the second mold layer.

A coefficient of thermal expansion (CTE) of the first mold layer and a CTE of the substrate may be within an order of magnitude.

A ratio of the coefficient of thermal expansion (CTE) of the first mold layer and a CTE of the substrate may be in a range from 3 to 1.

BRIEF DESCRIPTION OF THE DRAWINGS

The foregoing and other features of exemplary embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIG. 1D is a modified exemplary embodiment of FIG. 1B;

DETAILED DESCRIPTION OF EXEMPLARY EMBODIMENTS

Figure 1A:
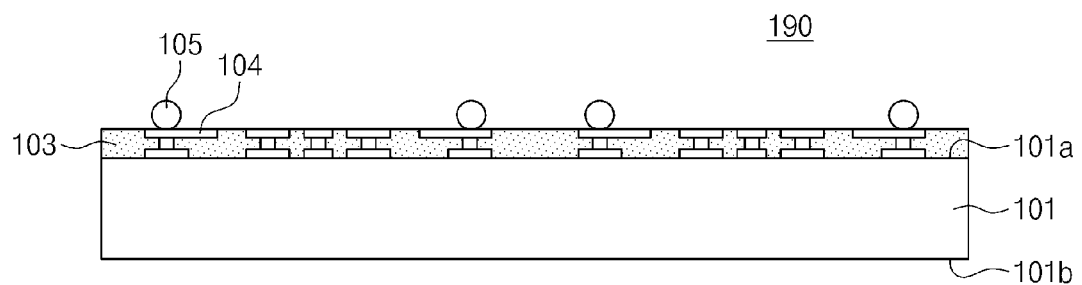
FIGS. 1A to 1J are cross sectional views illustrating a method for fabricating a semiconductor package according to exemplary embodiments.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements. Hereinafter, it will be described about an exemplary embodiment of the present invention in conjunction with the accompanying drawings.

Figure 1B:
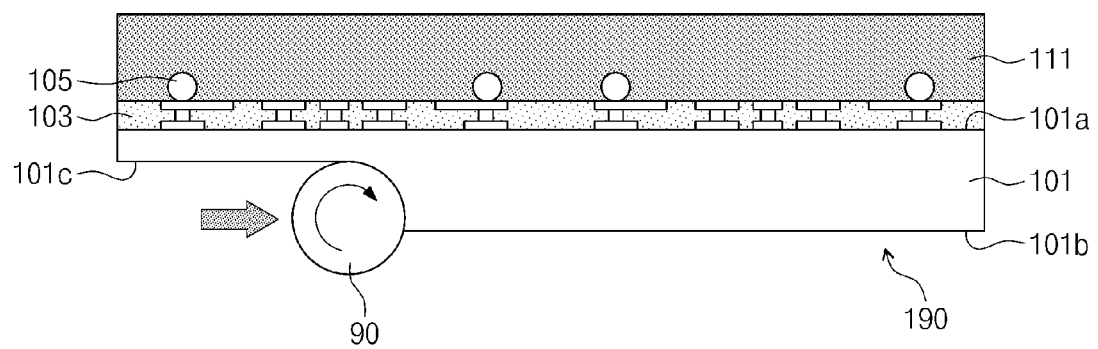
Figure 1C:
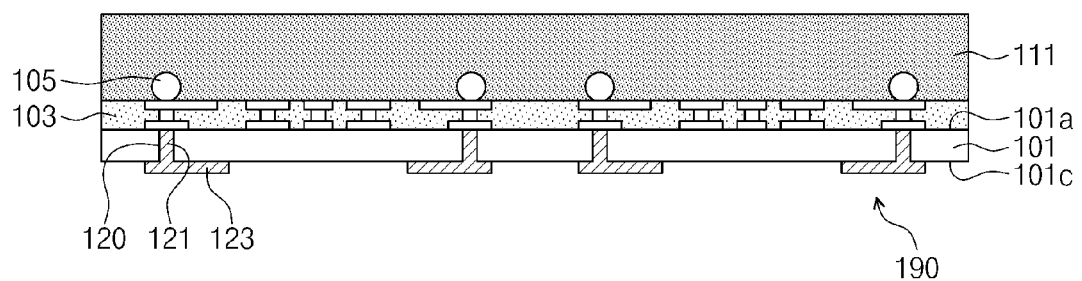
Figure 1D:
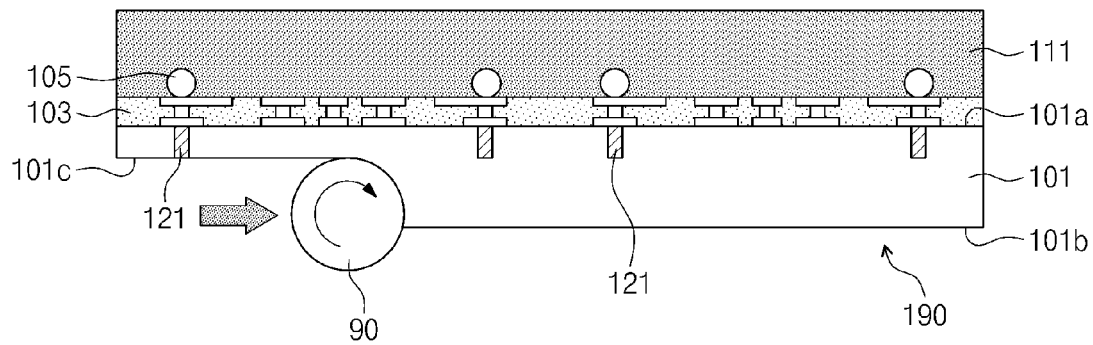

FIGS. 1A to 1J are cross sectional views illustrating a method for fabricating a semiconductor package according to exemplary embodiments. FIG. 1D is a modified exemplary embodiment of FIG. 1B.

Referring to FIG. 1A, there may be provided a wafer-level chip 190 including an active layer formed on a wafer 101. In an exemplary embodiment, the active layer is a circuit layer 103 but is not limited thereto. The wafer 101 may comprise a semiconductor substrate (e.g., silicon substrate) having a front surface 101a and a first back surface 101b. At least one bump 105 may be provided on the front surface 101a of the wafer-level chip 109 to be electrically connected to the circuit layer 103. The circuit layer 103 may comprise an integrated circuit such as a memory circuit, a logic circuit, and a combination thereof, and further comprise at least one front pad 104 electrically connected to the elements within the circuit layer 103. The bump 105 may be directly or indirectly coupled to the front pad 104 so as to be electrically connected to the circuit layer 103.

Referring to FIG. 1B, a front mold layer 111 may be formed on the wafer-level chip 190 and the wafer 101 may be worked to be thinner. For example, the front mold layer 111 may be formed on the front surface 101a of the wafer 101 and then the wafer 101 may be grinded. In some exemplary embodiments, the first back surface 101b of the wafer 101 may be grinded by a grinder 90 so that the wafer 101 is supported by the front mold layer 111. This wafer backside grinding process may reduce a thickness of the wafer 101 to expose a second back surface 101c. In an exemplary embodiment, the wafer 101 maybe thinned using a thinning process such as a mechanical process. In this specification, the front surface 101a may correspond to an active surface and the second back surface may correspond to an inactive surface.

The front mold layer 111 may have a thickness sufficient enough to provide rigidity or stiffness to the wafer 101 so the wafer 101 does not bend, flex, deform, or the like, and is held in place when the wafer backside grinding process is performed. Hereinafter, bending will be mentioned, but the exemplary embodiments are not limited thereto and may include flexing, deforming, warping and the like. The front mold layer 111 may comprise insulator, for example, high molecular substance such as epoxy resin. The epoxy resin may have a coefficient of temperature expansion (CTE) of about 50 to about 80 ppm/° C. and silicon constituting the wafer 101 may have about 3 ppm/° C. Due to the mismatch in CTE between the wafer 101 and the front mold layer 111, the wafer 101 may suffer from the warpage. Hence, the front mold layer 111 may comprise an epoxy filler composite including epoxy resin mixed with silica (e.g., content of about 80 wt %) as a filler and having a CTE of about 5 to 7 ppm/° C. The front mold layer 111 may have the CTE similar to that of silicon such that the warpage of the wafer 101 may be prevented or reduced. In an exemplary embodiment, the CTE of the wafer 101 and the CTE of the front mold layer 111 would be in the same order of magnitude, e.g., both CTEs would be between 1-10 ppm/° C. Alternatively, the ratio of the CTE of the first mold layer 111 to the CTE of the wafer 101 and would be in a range from 3 to 1.

In some exemplary embodiments, the front mold layer 111 may support the wafer 101 during the wafer backside grinding process such that there may be no need to attach a carrier to the wafer 101 with an adhesive layer between the wafer 101 and the carrier. In other words, the front mold layer 111 may act as the carrier during the wafer backside grinding process. Moreover, the front mold layer 111 may have the CTE similar to that of the wafer 101 such that the wafer 101 may be free of damage due to the warpage.

In an exemplary embodiment, the front mold layer 111 provides rigidity or stiffness to the overall wafer-level chip 109 including the circuit layer 103 and the wafer 101. In the wafer grinding process, the wafer-level chip 109, specifically, the front mold layer 111, is held by a device such as a vacuum chuck or other devices to provide rigidity or stiffness to prevent bending. In an exemplary embodiment, the vacuum chuck directly holds and is in direct contact with the front mold layer 111.

The device may be removably attached to the front mold layer 111 without using an adhesive. In an exemplary embodiment, the device is removably attached without bonding the device to the front mold layer 111. In yet another exemplary embodiment, the device may be removably attached to the front mold layer 111 without using an adhesive between the device and the front mold layer 111.

Referring to FIG. 1C, there may be formed at least one through electrode 121 that penetrates the wafer 101 to be electrically connected to the circuit layer 103. In other words, the through electrode 121 may be a through silicon via (TSV). For example, the inactive surface 101c of the wafer 101 may be dry-etched or drilled to form at least one vertical hole 120, and the vertical hole 120 may be filled with conductor such as tungsten or copper to form the through electrode 121. The tungsten or copper constituting the through electrode 121 may be formed by an electroplating process or a deposition process. At least one back pad 123 may be further formed on the inactive surface 101c of the wafer 101 to be electrically connected to the through electrode 121. The back pad 123 and the through electrode 121 may be formed simultaneously or separately. For example, an electroplating process may be performed to form the through electrode 121 and the back pad 123 at the same time. In this case, the back pad 123 and the through electrode 121 may constitute a single structure. As another example, the through electrode 121 may be formed by a first process (e.g., an electroplating process), and thereafter the back pad 123 may be formed by a second process (e.g., a deposition process) different from the first process.

Alternatively, as illustrated in FIG. 1D, the wafer 101 may comprise the through electrode 121 that partially penetrates the wafer 101 and does not reach the first back surface 101b. The front mold layer 111 may be formed on the front surface 101a of the wafer 101, and the first back surface 101b of the wafer 101 may be grinded by the grinder 90 in a state that the wafer 101 is supported by the front mold layer 111. The wafer backside grinding process may be performed to emerge the second back surface 101c that exposes the through electrode 121. The back pad 123 as illustrated in FIG. 1C may be formed on the second back surface 101c to be coupled to the through electrode 121.

In some exemplary embodiments, the through electrode 121 may be formed after the wafer backside grinding process (Via Last scheme), as illustrated in FIG. 1C, or before the wafer backside grinding process (Via First or Via Middle scheme), as illustrated in FIG. 1D. As described above, exemplary embodiments may be compatible with any one of the Via First, Via Middle and Via Last schemes.

Figure 1E:
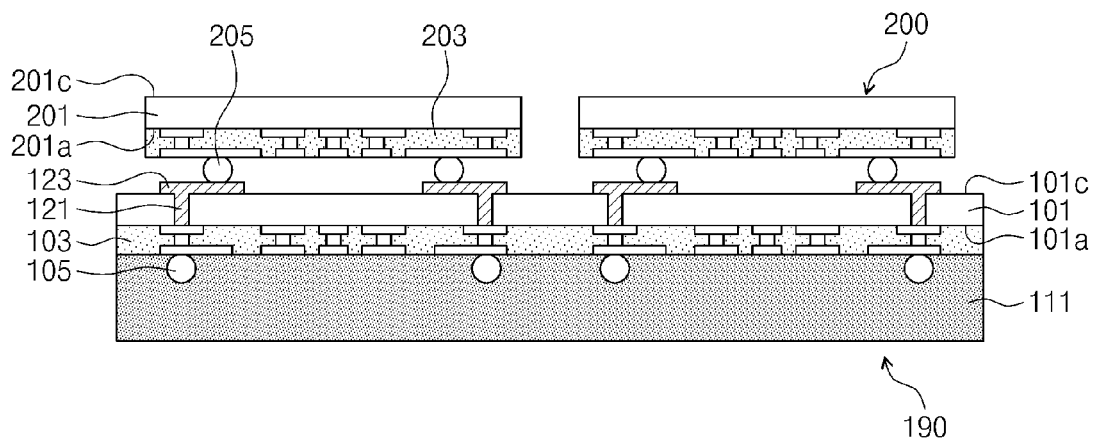

Referring to FIG. 1E, a plurality of chips 200 may be stacked on the wafer-level chip 190. Each of the chips 200 may comprise a substrate 201 having an active surface 201a and an inactive surface 201c, a circuit layer 203 disposed on the active surface 201a, and at least one bump 205 formed on the circuit layer 203 to be electrically connected thereto. For example, the chips 200 may be stacked in a flip-chip manner so that the active surface 201a of the substrate 201 faces the inactive surface 101c of the wafer 101. The wafer 101 may be upside down such that the inactive surface 101c may face upward. The chip 200 may be electrically connected to the circuit layer 103 of the wafer 101 by the bump 205 coupled to the through electrode 121. The circuit layer 203 of the chip 200 may comprise an integrated circuit such as a memory circuit, a logic circuit, and a combination thereof. The substrate 201 may be a chip-level semiconductor wafer. The bump 205 of the chip 200 may be vertically aligned with the through electrode 121 or may not be vertically aligned. The back pad 123 may be redistributed to electrically connect the through electrode 121 to the bump 205 vertically misaligned with the through electrode 121.

Figure 1F:
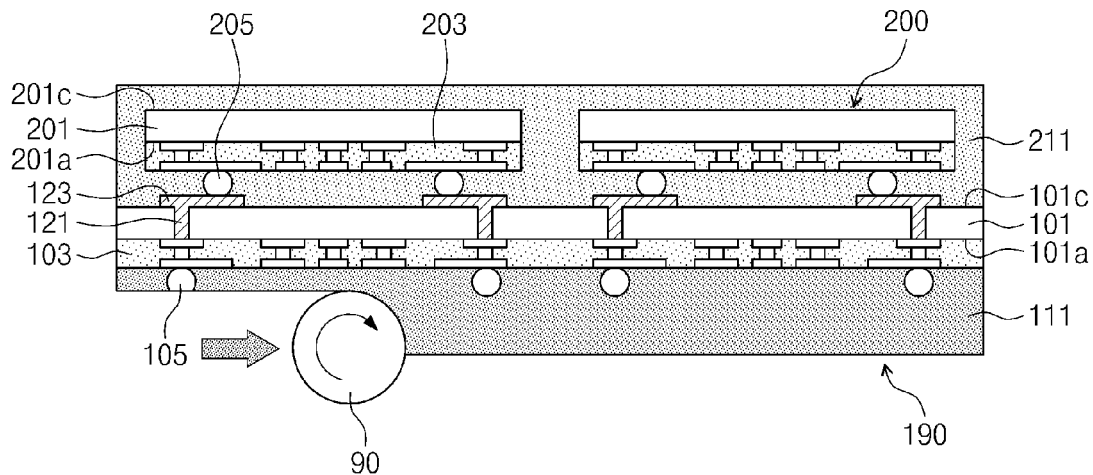

Referring to FIG. 1F, a back mold layer 211 may be formed on the inactive surface 101c of the wafer 101 so as to encapsulate the chips 200, and the front mold layer 111 may be removed. In an exemplary embodiment, the second mold layer 211 provides rigidity to the resultant structure, including the wafer 101. The back mold layer 211 may comprise epoxy filler composite identical or similar to that of the front mold layer 111. The front mold layer 111 may be removed by a grinding process, a chemical mechanical polishing process, or an etching process. In an exemplary embodiment, a smooth planar surface is thus formed. In some exemplary embodiments, the front mold layer 111 may be grinded by the grinder 90 until a portion of the bump 105 is exposed. Therefore, the active surface 101a or the circuit layer 103 may be covered with the front mold layer 111 that is partially removed, yet fills spaces between adjacent bumps 105. As described in FIG. 1B, a device such as a vacuum chuck or other devices may be removably attached to the back mold layer 211 in a similar manner when the front mold layer 111 is being grinded. In an exemplary embodiment, the vacuum chuck directly holds and is in direct contact with the back mold layer 211.

Figure 1G:
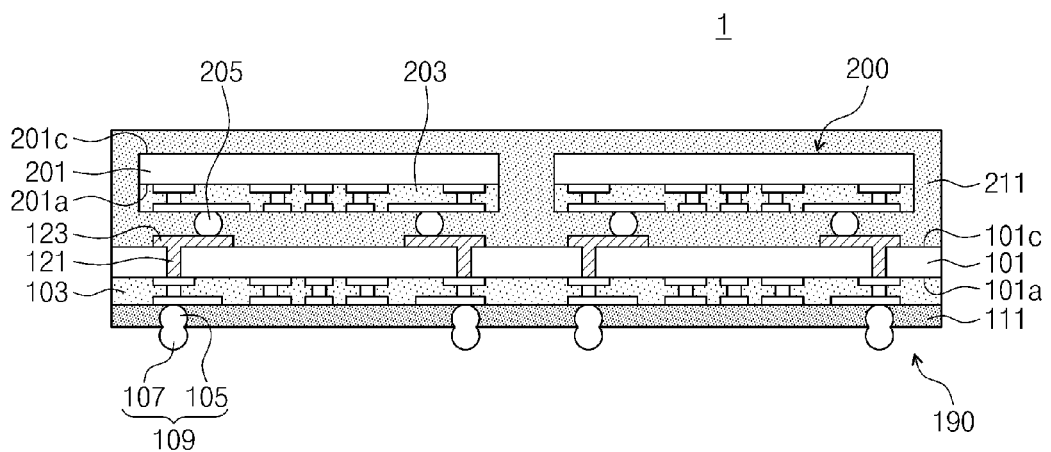

Referring to FIG. 1G, at least one second bump 107 may be attached to the at least one bump 105 to form at least one external terminal 109. The second bump 107 may be formed by reflowing solder paste provided on the bump 105. The solder paste may be provided by an evaporation process, an electrolytic plating process, an electroless plating process, a ball drop process, a screen printing process, and the like. Through the processes mentioned above, there may be fabricated a wafer-level package 1 including the plurality of chips 200 stacked on the wafer-level chip 190. The wafer-level package 1 may be selectively packaged as described later.

Figure 1H:
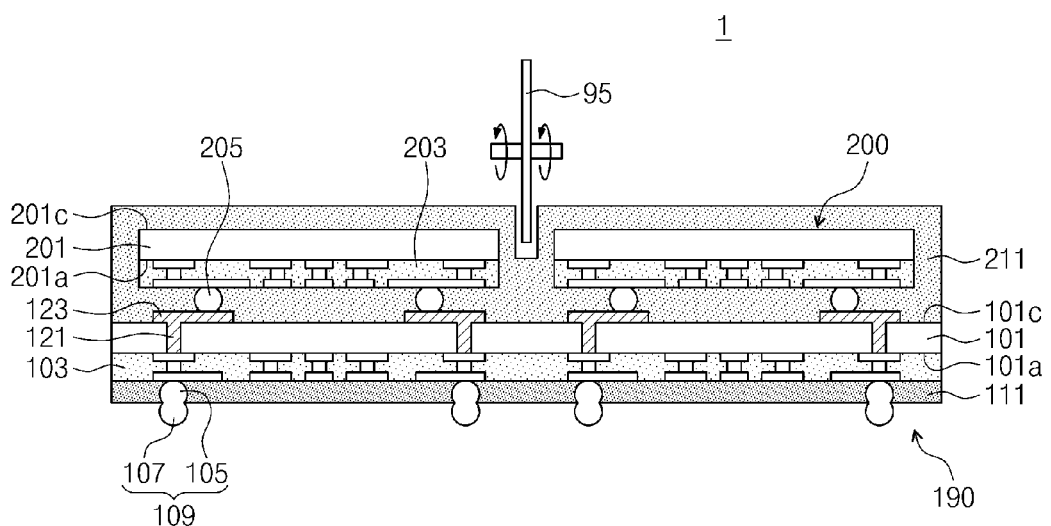

Referring to FIG. 1H, a dicing process may be performed on the wafer-level package 1. For example, a blade 95 or laser may divide the back mold layer 211 between adjacent chips 200, the wafer 101, and the front mold layer 111. Due to the dicing process, the wafer-level chip 190 may be separated into a plurality of chips 100 as illustrated in FIG. 1I.

Figure 1I:
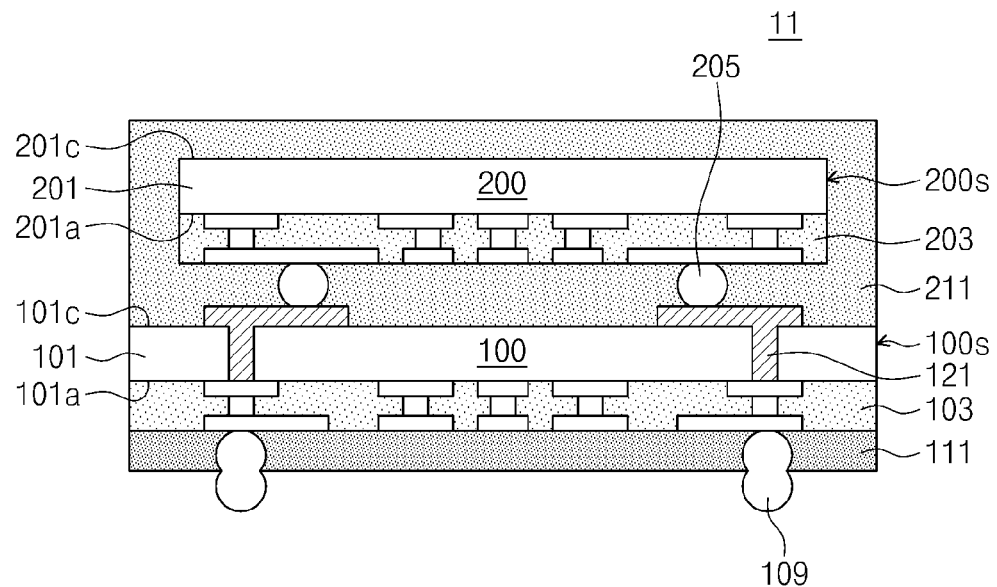

Referring to FIG. 1I, the dicing process may separate the wafer-level package 1 into a plurality of chip-level semiconductor packages 11 including the chip 200 (referred to as a slave chip) stacked on the chip 100 (referred to as a master chip). The master chip 100 may have a width greater than that of the slave chip 200. The master chip 100 may be formed by the dicing process performed on the wafer 101 such that lateral sides 100s of the master chip 100 may be exposed. Differently, the slave chip 200 may be encapsulated by the back mold layer 211 such that lateral sides 200s of the slave chip 200 may be not exposed. The front mold layer 111 may serve as a protection layer to cover the circuit layer 103 of the master chip 100. In an exemplary embodiment, the wafer-level package 1 is formed so that any one of a width of the front mold layer 111 and a width of the back mold layer 211, and a width of the cut wafer 101 of the wafer-level package 1 is substantially greater than a width of the slave chip 200. In yet another exemplary embodiment, the width of the front mold layer 111, the width of the back mold layer 211, and the width of the cut wafer 101 of the waver-level package 1 are substantially same.

According to embodiments of the present invention, the semiconductor package 11 may have a back-to-front structure where the inactive surface 101c (or back side) of the master chip 100 faces the active surface 201a (or front side) of the slave chip 200. The bump 205 of the slave chip 200 may be coupled to the through electrode 121 of the master chip 100, which may electrically connect the slave chip 200 to the master chip 100. The external terminal 109 may protrude from the front mold layer 111 to easily electrically connect the semiconductor package 11 to any electrical apparatus such as a semiconductor chip, a semiconductor package, a printed circuit board, a module substrate, and so forth. In one exemplary embodiment, the back mold layer 211 is not disposed between the slave chip 200 and the cut wafer 101.

Figure 1J:
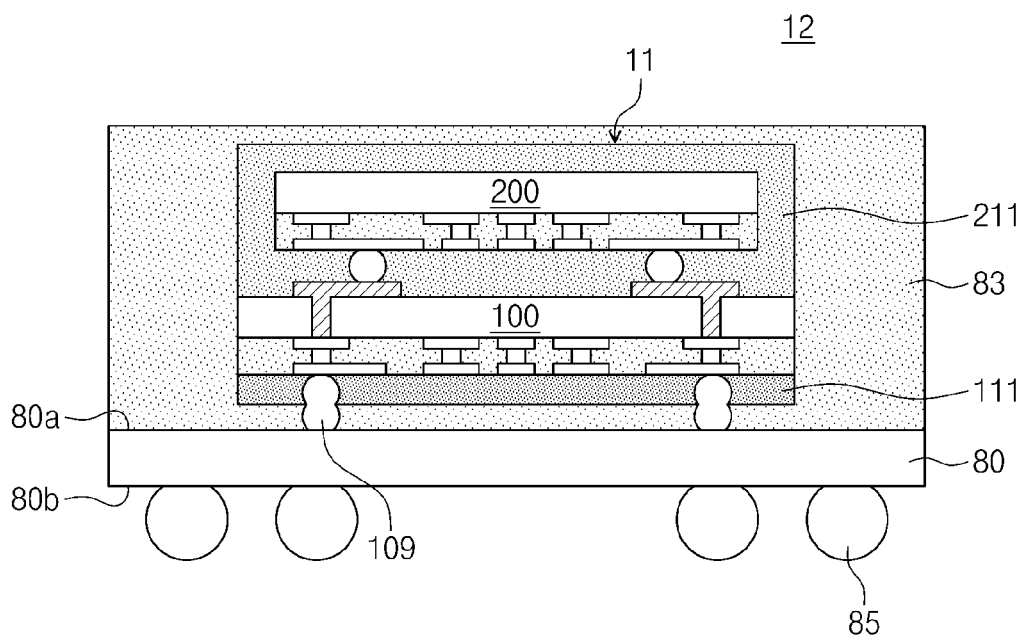

Referring to FIG. 1J, the semiconductor package 11 may be mounted on a package substrate 80 to fabricate a semiconductor package 12. For example, the semiconductor package 12 may be fabricated by mounting the semiconductor package 11 on a front surface 80a of the package substrate 80 such as a printed circuit board and forming an outer mold layer 83 to encapsulate the semiconductor package 11. At least one solder ball 85 may be attached to a back surface 80b of the package substrate 80. The master chip 100 may be encapsulated by the front mold layer 111, the back mold layer 211 and the outer mold layer 83. The slave chip 200 may be dually encapsulated by the back mold layer 211 and the outer mold layer 83 enclosing the back mold layer 211. The semiconductor package 11 may be electrically connected to the package substrate 80 by the external terminal 109 and electrically connected to any electrical apparatus (e.g., a semiconductor chip, a semiconductor package, a module substrate) by the solder ball 85.

FIGS. 2A to 2D are cross sectional views illustrating a method for fabricating a semiconductor package according to exemplary embodiments of the present inventive concepts. For concise description, previously described elements may be identified by similar or identical reference numbers without repeating overlapping descriptions thereof.

Figure 2A:
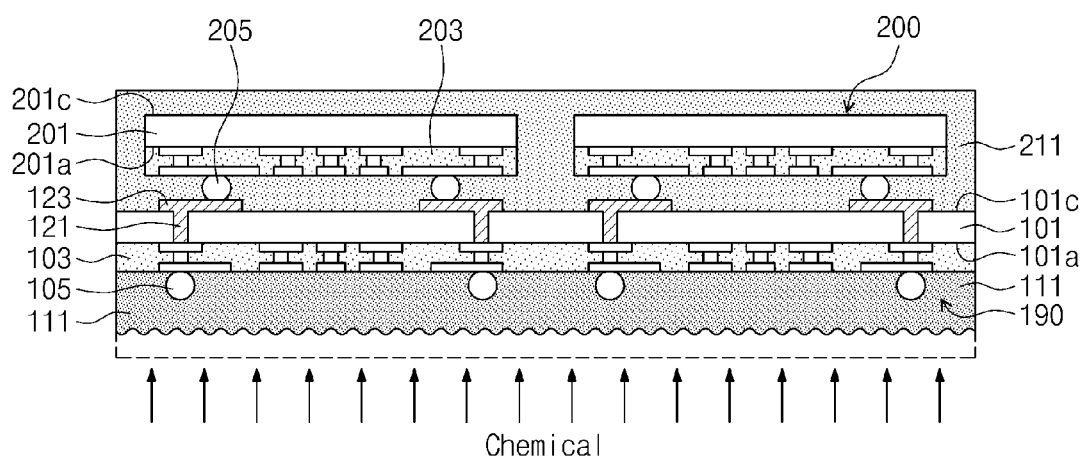
FIGS. 2A to 2D are cross sectional views illustrating a method for fabricating a semiconductor package according to exemplary embodiments.

Referring to FIG. 2A, the plurality of chips 200 may be stacked on the wafer-level chip 190 and the front mold layer 111 may be removed. For example, identical or similar to the descriptions with reference to FIGS. 1A to 1F, the front mold layer 111 may be formed on the active surface 101a of the wafer 101 and then the wafer 101 may be grinded, the through electrode 121 and the back pad 123 may be formed and then the plurality of chips 200 may be mounted in the flip-chip manner on the inactive surface 101c of the wafer 101, and thereafter the back mold layer 211 may be formed to encapsulate the chips 200 and then the front mold layer 111 may be removed. In some embodiments, chemical capable of selectively etching the front mold layer 111 may be provided to remove the front mold layer 111.

Figure 2B:
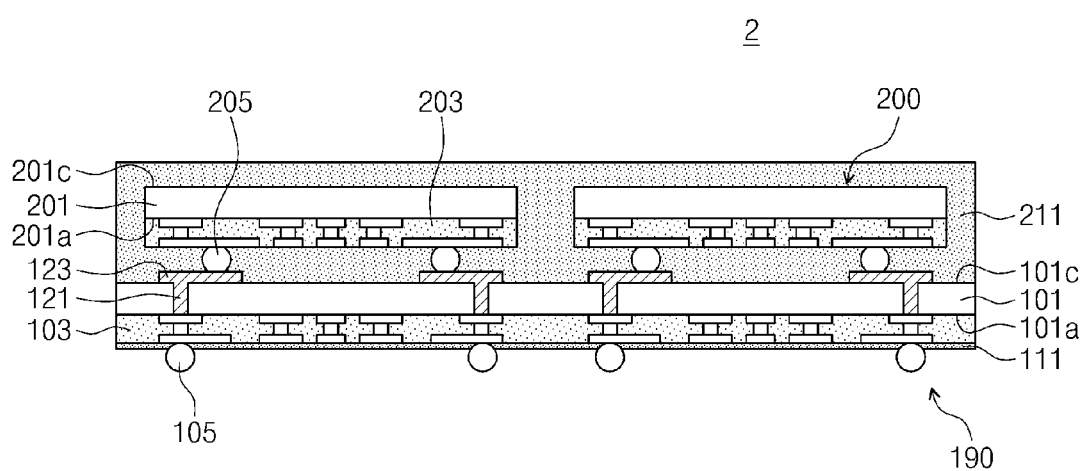

Referring to FIG. 2B, the removal of the front mold layer 111 may fabricate a wafer-level package 2 including the plurality of chips 200 mounted in the flip-chip manner on the inactive surface 101c of the wafer 101. In some embodiments, the front mold layer 111 may be completely removed to make the bump 105 entirely exposed. Alternatively, the front mold layer 111 may be partially removed to remain on the active surface 101a or the circuit layer 103. In this case, the remained mold layer 111 may have a thickness less than the height of the bump 105 so that the bump 105 may protrude from the remained front mold layer 111.

Figure 2C:
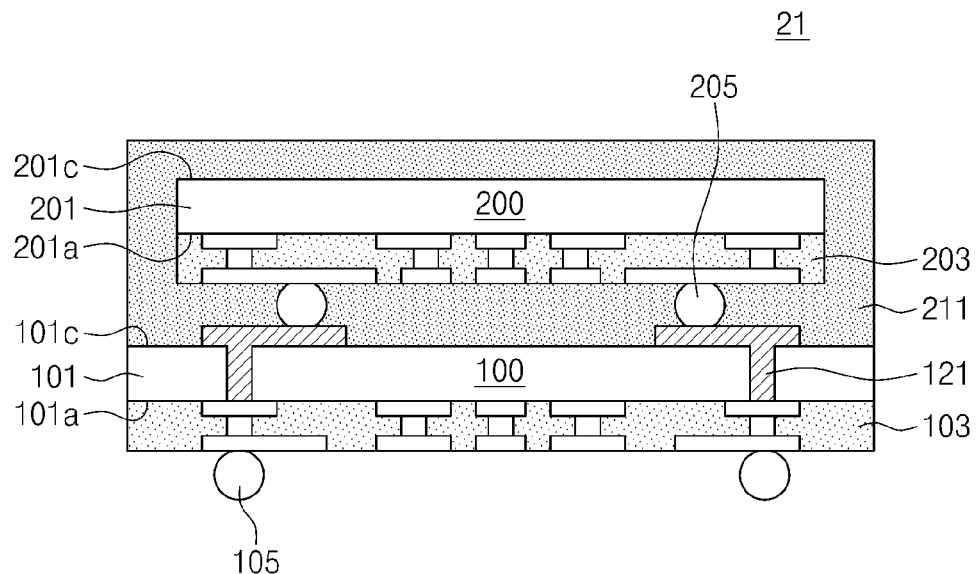

Referring to FIG. 2C, the wafer-level package 2 may be divided into a plurality of semiconductor packages 21 including the slave chip 200 stacked on the master chip 100. The semiconductor package 21 may have a back-to-front structure where the inactive surface 101c (or back side) of the master chip 100 faces the active surface 201a (or front side) of the slave chip 200. In some embodiments, the bump 105 may be so protruded that there may be no need to form a second bump attached to the bump 105.

Figure 2D:
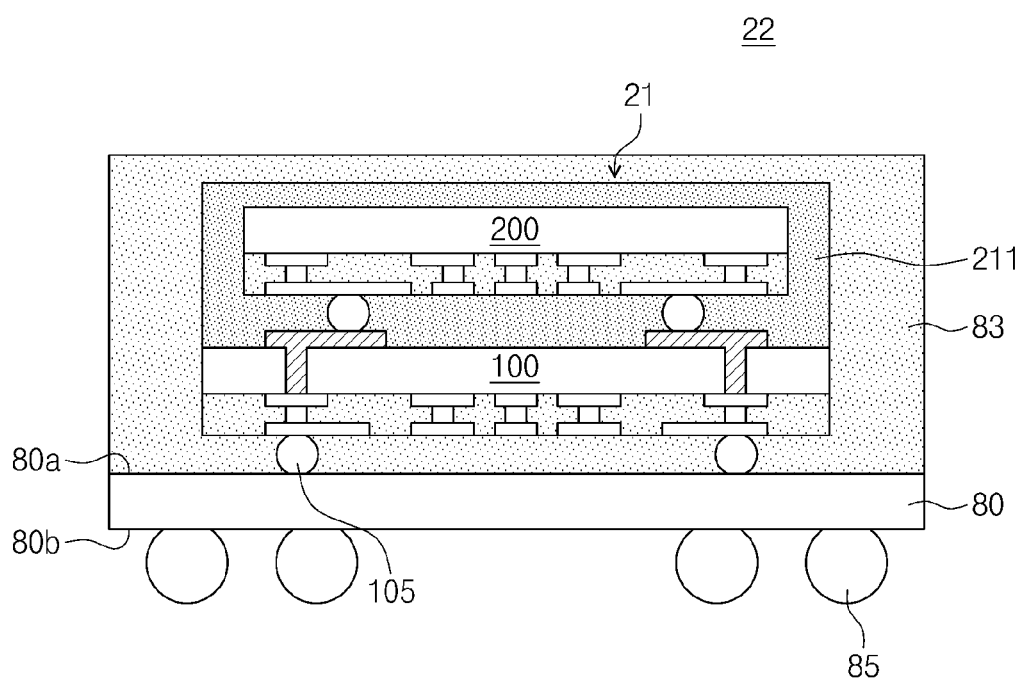

Referring to FIG. 2D, the semiconductor package 21 may be mounted on the front surface 80a of the package substrate 80 (e.g., printed circuit board) and the outer mold layer 83 may be formed to encapsulate the semiconductor package 21, which fabricates a semiconductor package 22. The master chip 100 may be encapsulated by the back mold layer 211 and the outer mold layer 83. The slave chip 200 may be dually molded by the back mold layer 211 and the outer mold layer 83.

Figure 3A:
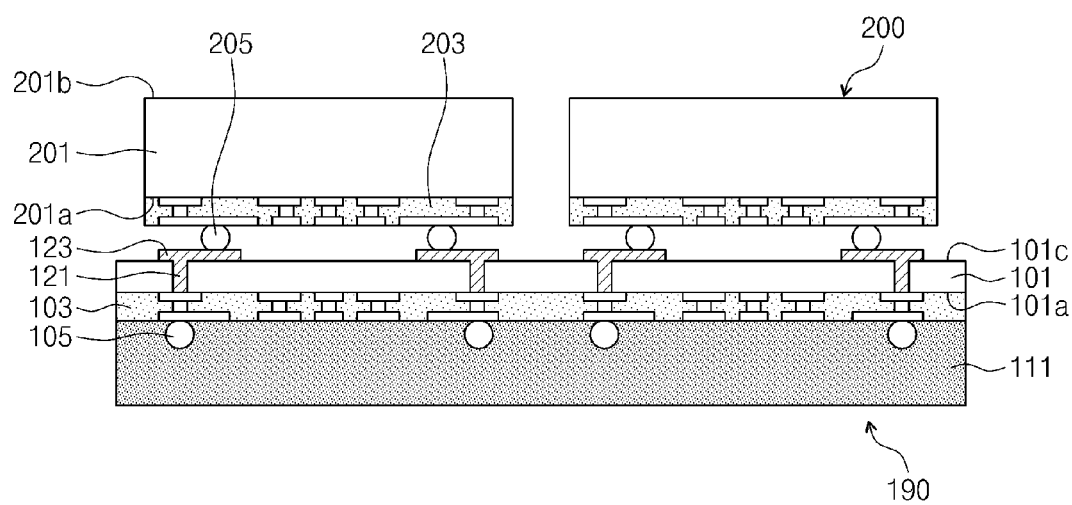
FIGS. 3A to 3H are cross sectional views illustrating a method for fabricating a semiconductor package according to exemplary embodiments.

FIGS. 3A to 1H are cross sectional views illustrating a method for fabricating a semiconductor package according to exemplary embodiments of the present inventive concepts. FIGS. 3I and 3J are modified exemplary embodiments of FIGS. 3A and 3G, respectively. For concise description, previously described elements may be identified by similar or identical reference numbers without repeating overlapping descriptions thereof.

Referring to FIG. 3A, the plurality of chips 200 may be stacked on the wafer-level chip 190. For example, identical or similar to the descriptions with reference to FIGS. 1A to 1E, the front mold layer 111 may be formed on the active surface 101a of the wafer 101 and then the wafer 101 may be grinded, and thereafter the through electrode 121 and the back pad 123 may be formed and then the plurality of chips 200 may be mounted on the inactive surface 101c of the wafer 101. The chip 200 may comprise the substrate 201 including the front surface 201a and a first back surface 201b, the circuit layer 203 disposed on the substrate 201, and the bump 205 provided on the circuit layer 203. The chip 200 may be mounted in the flip-chip manner on the inactive surface 101c of the wafer 101 and electrically connected to the circuit layer 103 of the wafer 101 by the bump 205 coupled to the through electrode 121.

Figure 3B:
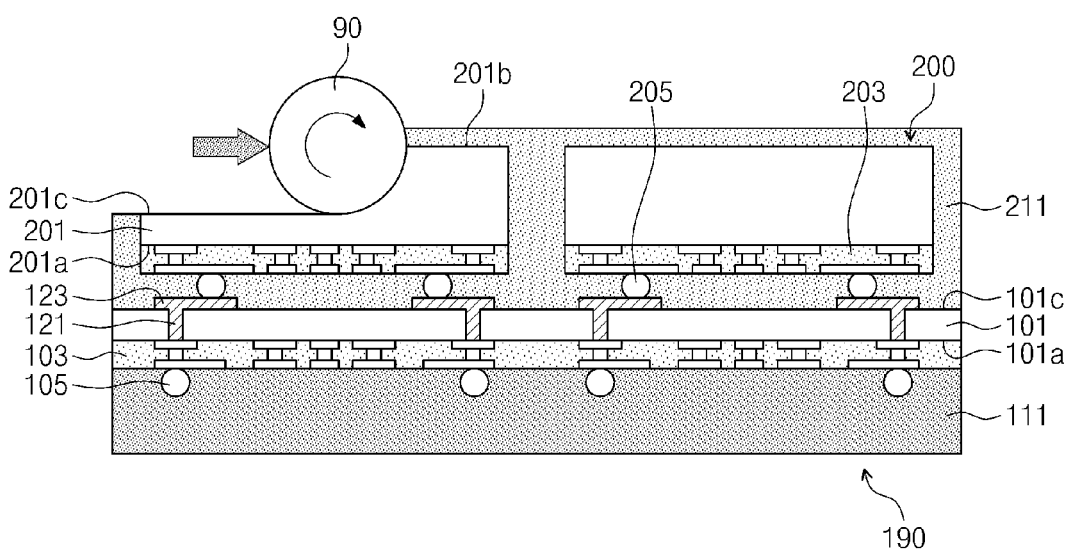

Referring to FIG. 3B, the back mold layer 211 may be formed on the wafer-level chip 190 and then the chips 200 may be thinned. For example, the back mold layer 211 may be formed on the wafer-level chip 190 in order to encapsulate the chips 200 and then the chips 200 may be grinded. The back mold layer 211 may cover or expose the first back surface 201b of the chip 200. The chip 200 may be grinded by a grinding process using the grinder 90 or a chemical mechanical polishing process. Due to the grinding of the chip 200, the first back surface 201b of the chip 200 may be grinded to emerge a second surface 201c (referred to as an inactive surface). The back mold layer 211 may be grinded together with the chip 200 to have a shape encapsulating the chip 200 but exposing the inactive surface 201c of the chip 200. The back mold layer 211 may fill spaces between the adjacent chips 200 and between the chips 200 and the wafer 101.

Figure 3C:
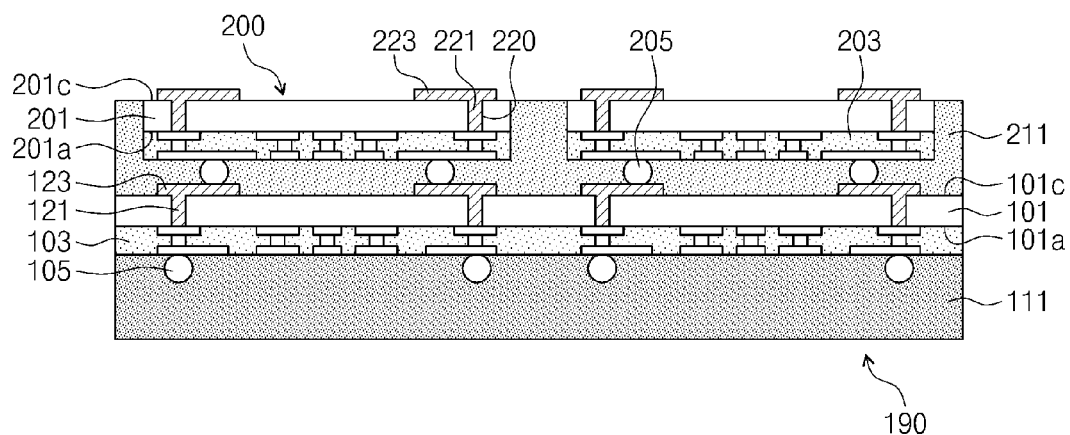

Referring to FIG. 3C, at least one through electrode 221 may be formed to penetrate the substrate 201 of the chip 200 so as to be electrically connected to the circuit layer 203. For example, the inactive surface 201c of the chip 200 may be dry-etched or drilled to form at least one vertical hole 220, and the vertical hole 220 may be filled with conductor such as tungsten or copper to form the through electrode 221. The tungsten or copper constituting the through electrode 221 may be formed by an electroplating process or a deposition process. At least one back pad 223 may be further formed on the inactive surface 201c of the chip 200 to be connected to the through electrode 221. The back pad 223 and the through electrode 221 may be formed simultaneously using a same process (e.g., electroplating process). Therefore, the back pad 223 and the through electrode 221 may constitute a single structure. Alternatively, the back pad 223 and the through electrode 221 may be formed separately using different processes. Differently, the chip 200 may comprise the through electrode 221 formed by the Via First or Via Middle scheme, as illustrated in FIG. 1D. In this case, the chip 200 may be grinded to expose the through electrode 221 and then the back pad 223 may be formed to be coupled to the through electrode 221.

Figure 3D:
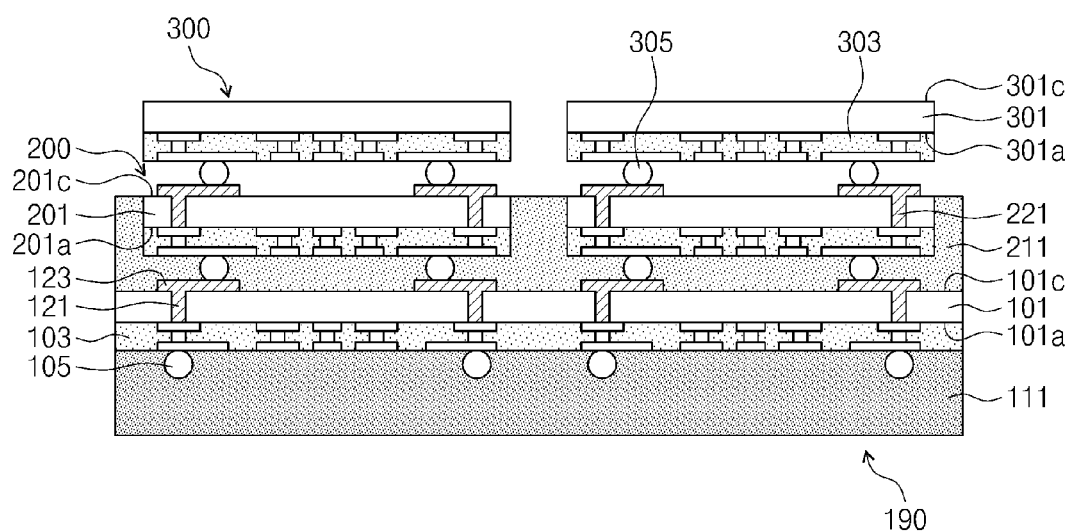

Referring to FIG. 3D, a plurality of chips 300 may be mounted on the inactive surfaces 201c of the chip 200s. The chip 200 (referred to as a first slave chip) and the chips 300 (referred to as a second slave chip) may be in a one-to-one correspondence. The second slave chip 300 may comprise a substrate 301 including an active surface 301a and an inactive surface 301c, a circuit layer 303 disposed on the substrate 301, and at least one bump 305 provided on the circuit layer 303. The second slave chip 300 may be mounted in the flip-chip manner on the inactive surface 201c of the first slave chip 200 and the bump 305 may be coupled to the through electrode 221, which may electrically connect the second slave chip 300 to the first slave chip 200. The circuit layer 303 of the second slave chip 300 may comprise an integrated circuit such as a memory circuit, a logic circuit, and a combination thereof. The substrate 301 of the second slave chip 300 may be a chip-level semiconductor wafer.

Figure 3E:
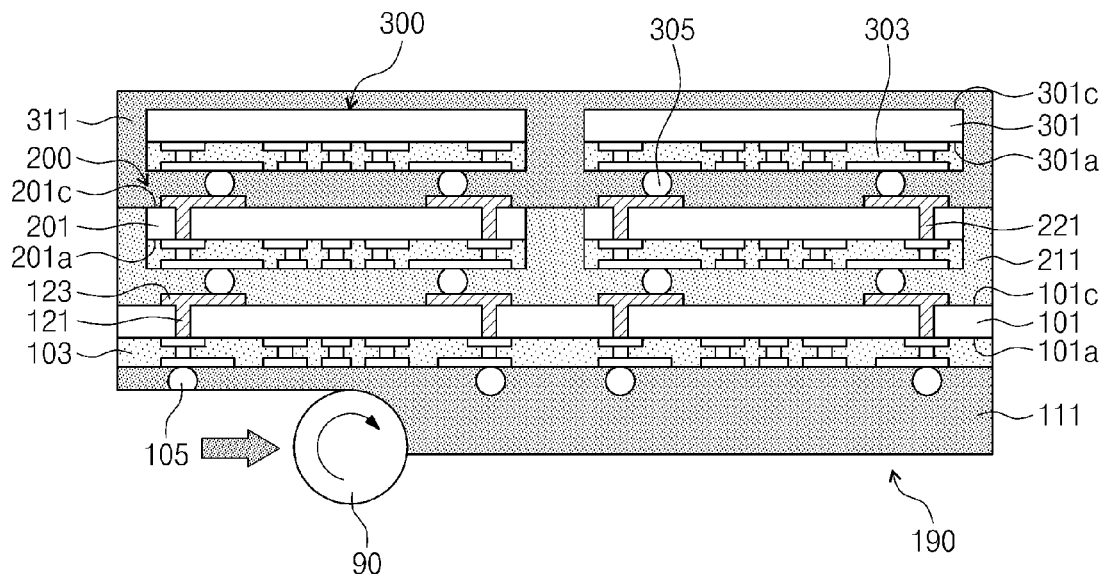

Referring to FIG. 3E, a second back mold layer 311 may be formed to encapsulate the second slave chips 300 and then the front mold layer 111 may be removed. For example, the front mold layer 111 may be grinded by the grinder 90 so as to expose the bump 105. A portion of the front mold layer 111 may remain on the active surface 101a of the wafer 101 and fill spaces between adjacent bumps 105. Alternatively, the front mold layer 111 may be completely removed using chemical, as illustrated in FIG. 2A. Differently, the front mold layer 111 may remain on the active surface 101a of the wafer 101, as illustrated in FIG. 2B. In this case, the bump 105 may protrude from the remained front mold layer 111.

Figure 3F:
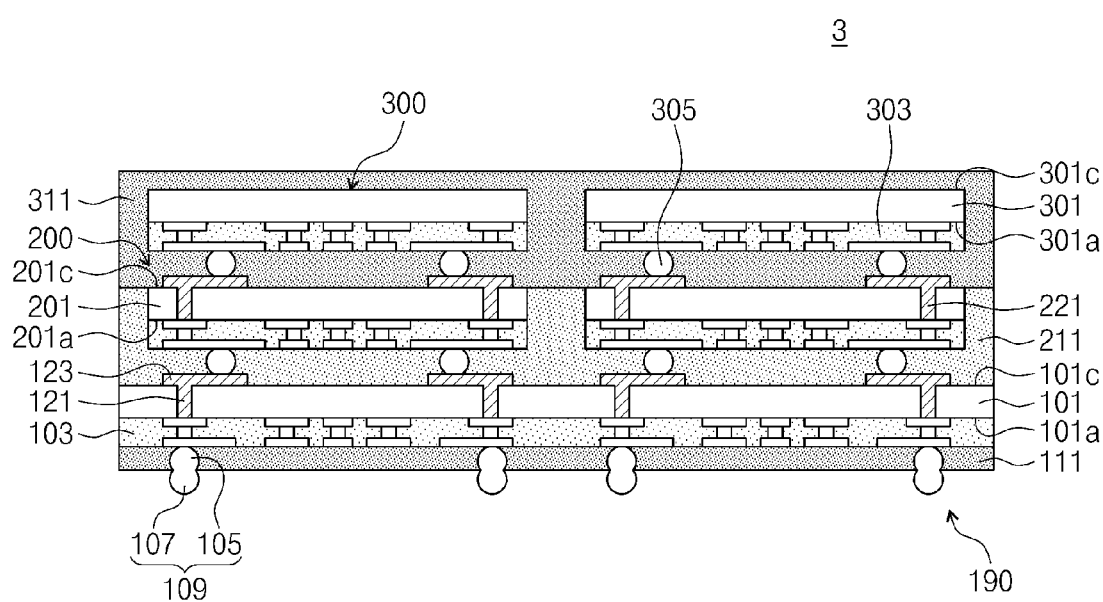

Referring to FIG. 3F, a wafer-level package 3 may be fabricated by attaching the second bump 107 to the bump 105 in order to form the external terminal 109. The wafer-level package 3 may comprise the first and second slave chips 200 and 300 mounted in the flip-chip manner on the wafer-level chip 190.

Figure 3G:
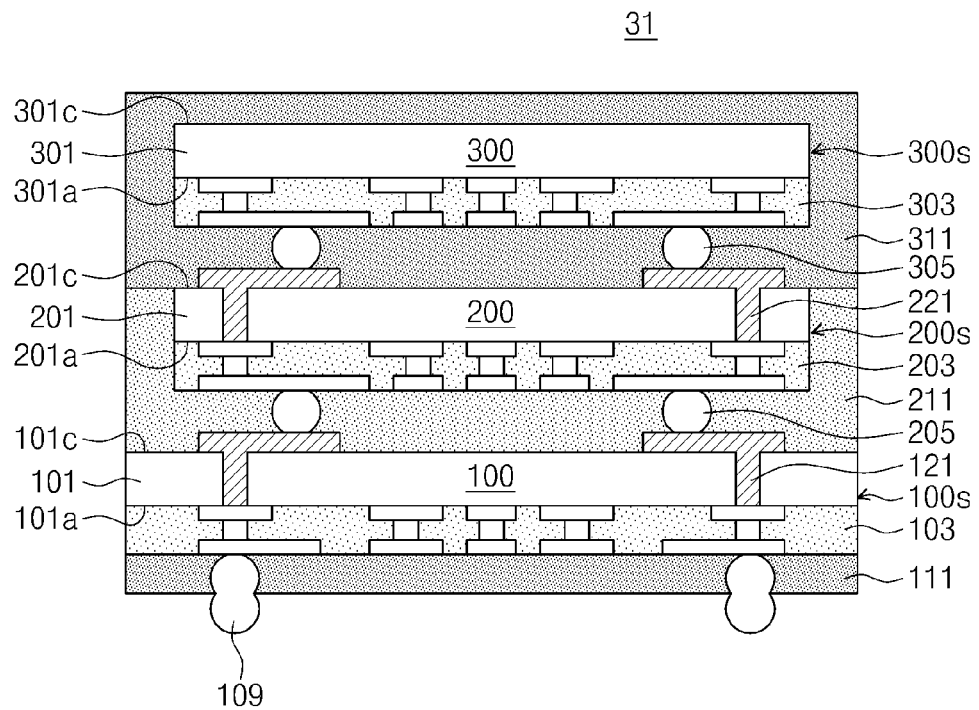

Referring to FIG. 3G, a dicing process may be performed on the wafer-level package 3. The dicing process may separate the wafer-level package 3 into a plurality of semiconductor packages 31 including the first and second slave chips 200 and 300 mounted in the flip-chip manner on the master chip 100. When the dicing process is performed, the wafer 101 may be divided into the plurality of master chips 100. The semiconductor package 31 may have a first back-to-front structure between the master chip 100 and the first slave chip 200 and a second back-to-front structure between the first slave chip 200 and the second slave chip 300. The bump 205 of the first slave chip 200 may be coupled to the through electrode 121 of the master chip 100, which electrically connects the first slave chip 200 to the master chip 100. The bump 305 of the second slave chip 300 may be coupled to the through electrode 221 of the first slave chip 200, which electrically connects the second slave chip 300 to the first slave chip 200.

The master chip 100 may have a width greater than those of the first and second slave chips 200 and 300. The first slave chip 200 may have a width identical or similar to that of the second slave chip 300. The master chip 100 may be formed by the dicing process performed on the wafer 101 such that the lateral sides 100s of the master chip 100 may be exposed. Differently, the first slave chip 200 may be encapsulated by the back mold layer 211 and the second slave chip 300 may be encapsulated by the second back mold layer 311, so that lateral sides 200s and 300s of the first and second slave chips 200 and 300 may be not exposed.

Figure 3H:
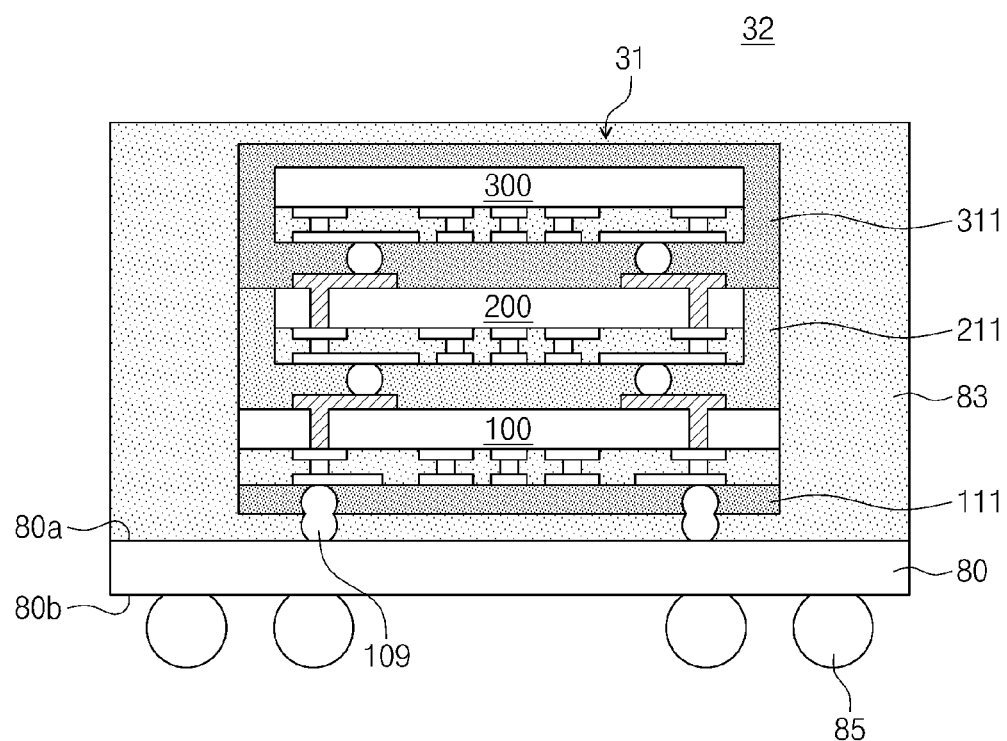
Figure 3I:
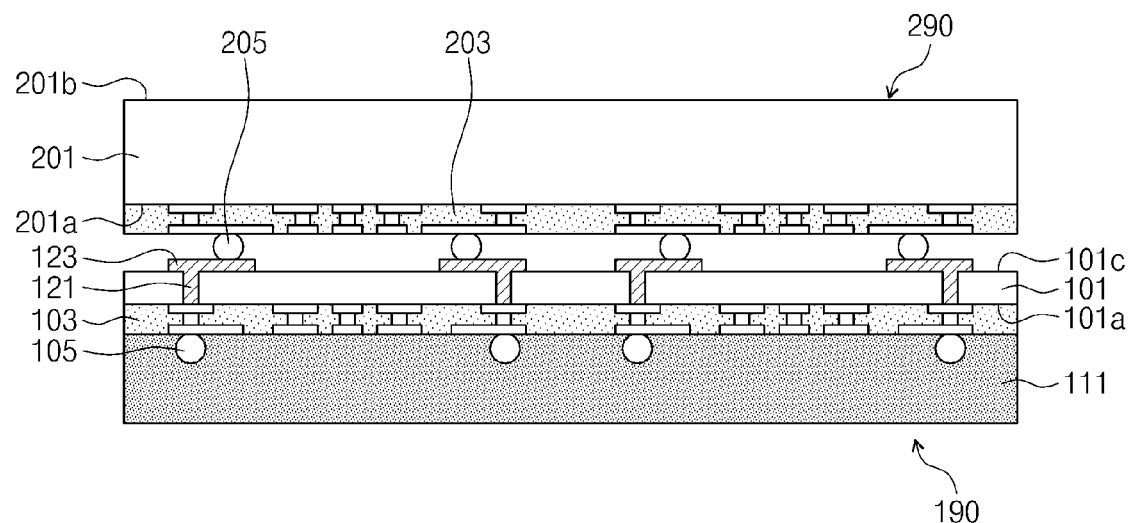
FIGS. 3I and 3J are modified exemplary embodiments of FIGS. 3A and 3G, respectively.
Figure 3J:
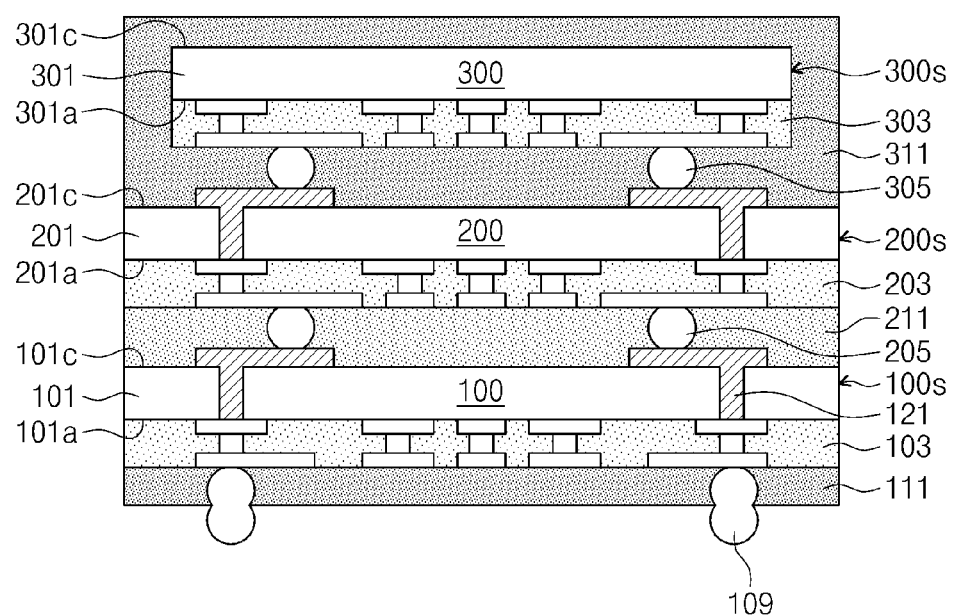

Referring to FIG. 3H, the semiconductor package 31 may be mounted on the front surface 80a of the package substrate 80 (e.g., printed circuit board) and the outer mold layer 83 may be formed to encapsulate the semiconductor package 31, which fabricates a semiconductor package 32. The master chip 100 may be encapsulated by the back mold layer 211, the second back mold layer 311 and the outer mold layer 83. The first slave chip 200 may be molded by the outer mold layer 83 which surrounds the first and second mold layers 211 and 311. The second slave chip 300 may be dually encapsulated by the second back mold layer 311 and the outer mold layer 83.

Alternatively, as illustrated in FIG. 3I, an upper wafer-level chip 290 may be stacked on the wafer-level chip 190. The upper wafer-level chip 290 may comprise an upper wafer 201 on which the circuit layer 203 and the bump 205 are provided. The upper wafer 201 may be stacked on the wafer 101 in a state that an active surface 201a of the upper wafer 201 faces the inactive surface 101c of the wafer 101. A first back surface 201b of the upper wafer 201 may be grinded to emerge the inactive surface 201c, as illustrated in FIG. 3B.

Processes, identical or similar to those as illustrated in FIGS. 3B to 3G, may be performed to fabricate a semiconductor package 31a including the first and second slave chips 200 and 300 stacked in the flip-chip manner on the master chip 100. The master chip 100 may be formed by the dicing process performed on the wafer 101 such that the lateral sides 100s of the master chip 100 may be exposed. Similarly, the first slave chip 200 may be formed by the dicing process performed on the upper wafer 201 such that the lateral sides 200s of the first slave chip 200 may be exposed. Differently, the second slave chip 300 may be encapsulated by the second back mold layer 311 such that the lateral sides 300s of the second slave chip 300 may be not exposed. Identically or similarly to the semiconductor package 32 as illustrated in FIG. 3H, the semiconductor package 31a may be mounted on the package substrate 80 and encapsulated by the outer mold layer 83.

FIGS. 4A to 4E are cross sectional views illustrating a method for fabricating a semiconductor package according to exemplary embodiments of the present inventive concepts. For concise description, previously described elements may be identified by similar or identical reference numbers without repeating overlapping descriptions thereof.

Figure 4A:
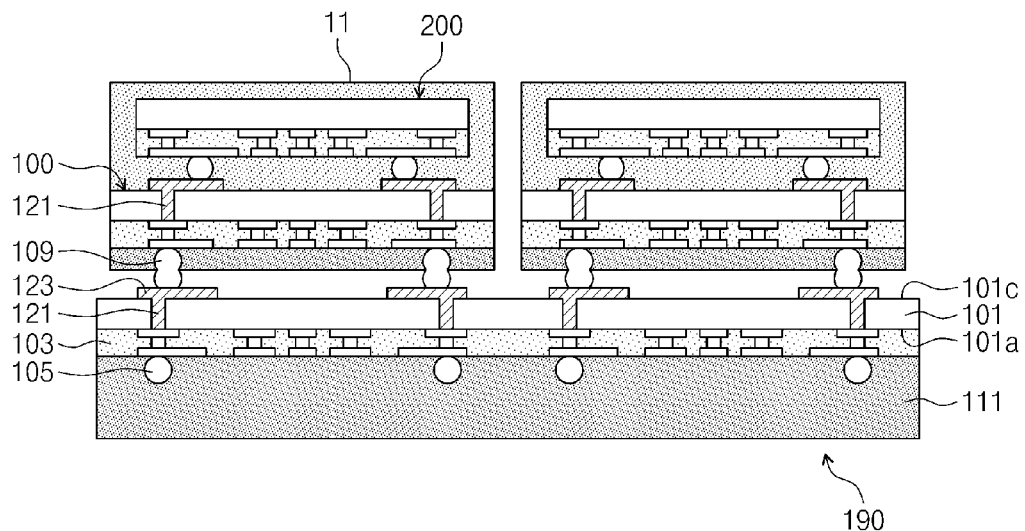
FIGS. 4A to 4E are cross sectional views illustrating a method for fabricating a semiconductor package according to exemplary embodiments.

Referring to FIG. 4A, a plurality of the semiconductor packages 11 may be stacked on the wafer-level chip 190. For example, identical or similar to the descriptions with reference to FIGS. 1A to 1C, the front mold layer 111 may be formed on the active surface 101a of the wafer 101 and then the wafer 101 may be grinded, and thereafter the through electrode 121 and the back pad 123 may be formed. The plurality of the semiconductor packages 11 of FIG. 1I may be stacked on the inactive surface 101c of the wafer 101. The external terminal 109 of the semiconductor package 11 may be coupled to the through electrode 121 of the wafer-level chip 190 such that the semiconductor package 11 may be electrically connected to the wafer-level chip 190.

Figure 4B:
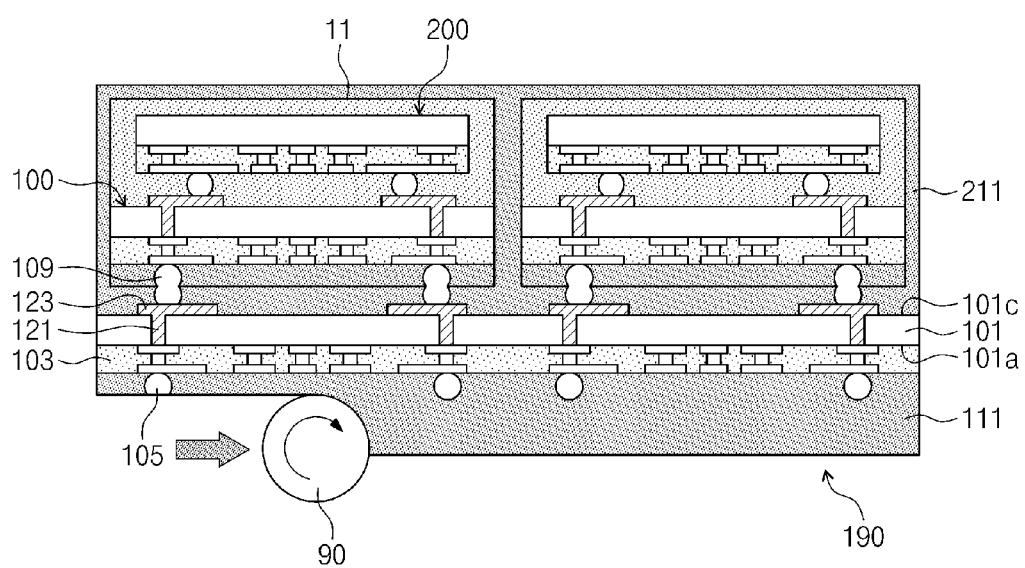

Referring to FIG. 4B, the back mold layer 211 may be formed on the inactive surface 101c of the wafer 101 so as to encapsulate the semiconductor packages 11 and then the front mold layer 111 may be removed. The front mold layer 111 may be removed by a grinding process using the grinder 90 or an etching process using chemical. For example, the front mold layer 111 may be grinded by the grinder 90 and the bump 105 may be exposed through the grinded front mold layer 111.

Figure 4C:
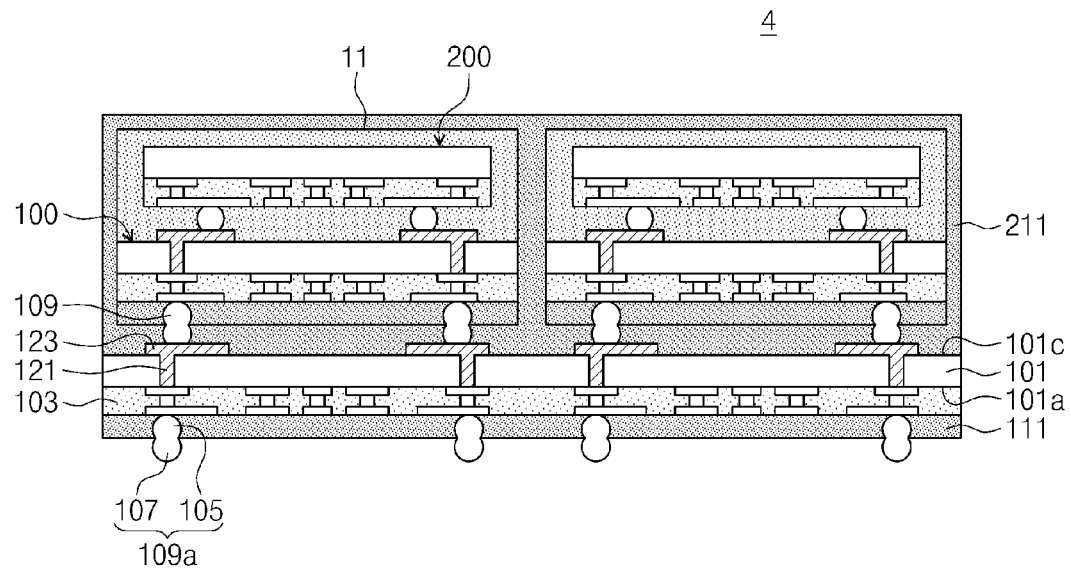

Referring to FIG. 4C, the second bump 107 may be attached to the bump 105 to form an external terminal 109a, which may fabricate a wafer-level package 4. The wafer-level package 4 may comprise the plurality of the semiconductor packages 11 mounted on the wafer-level chip 190.

Figure 4D:
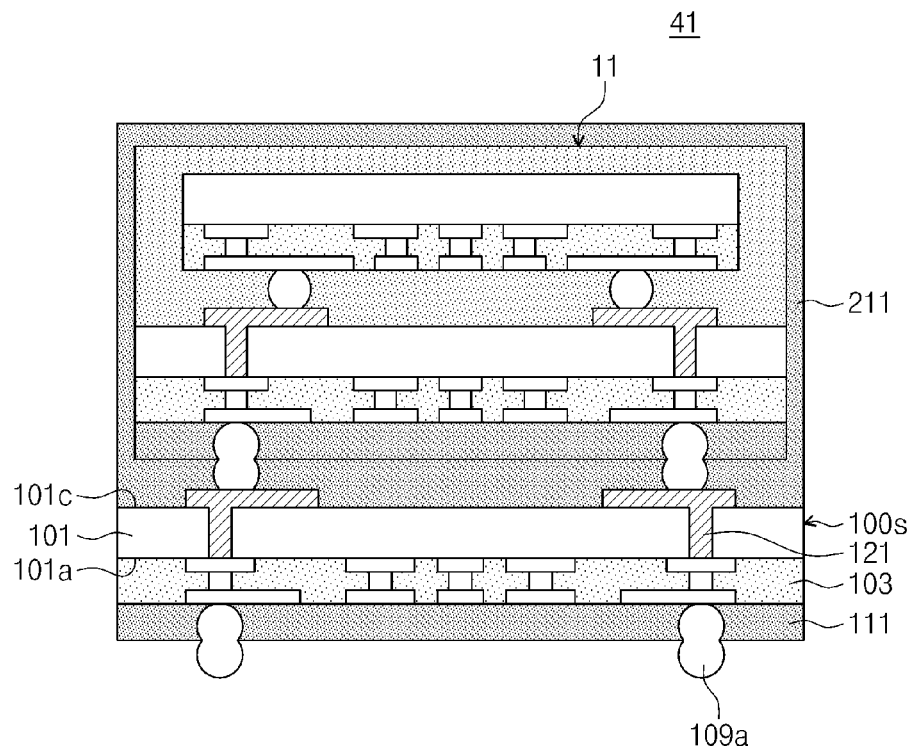

Referring to FIG. 4D, a dicing process may be performed on the wafer-level package 4 to fabricate a semiconductor package 41 including the semiconductor package 11 mounted on the master chip 100 formed from the divided wafer 101. In some embodiments, the lateral sides 100s of the master chip 100 may be exposed and the semiconductor package 11 may be encapsulated by the back mold layer 211.

Figure 4E:
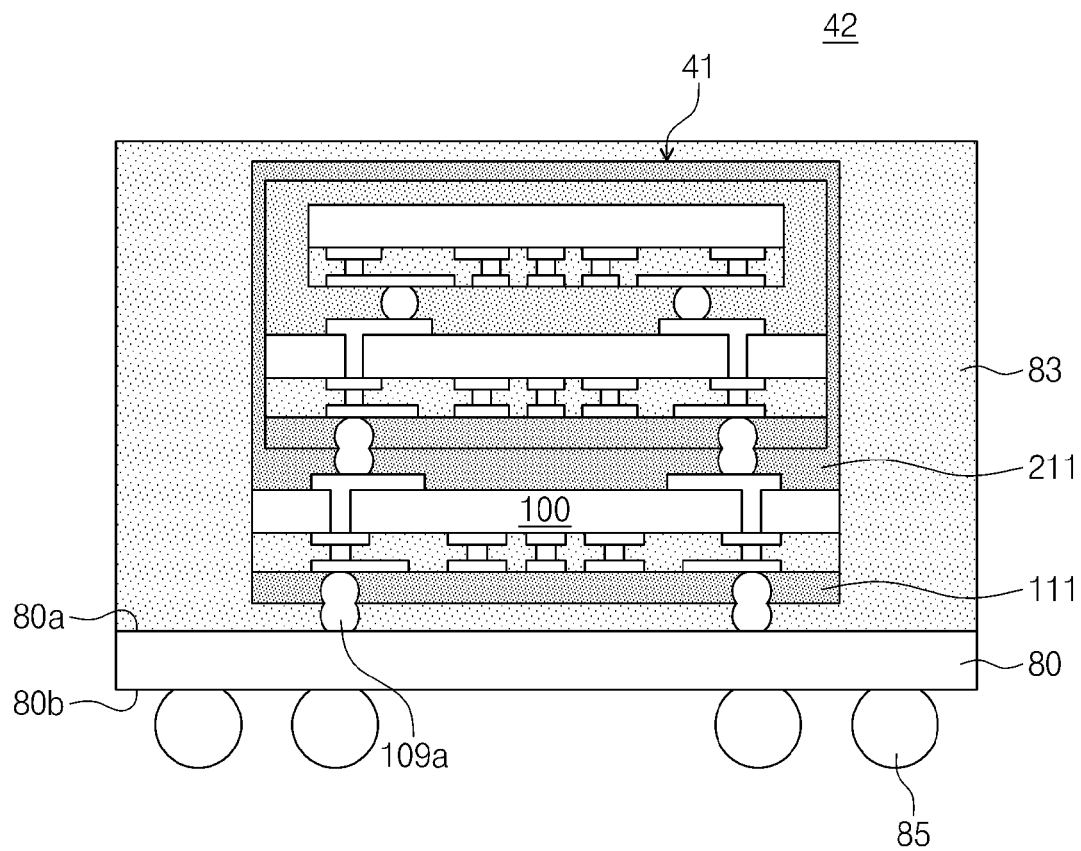

Referring to FIG. 4E, the semiconductor package 41 may be mounted on the front surface 80a of the package substrate 80 (e.g., printed circuit board) and the outer mold layer 83 may be formed to encapsulate the semiconductor package 41, which fabricates a semiconductor package 42. The master chip 100 may be encapsulated by the front mold layer 111, the back mold layer 211 and the outer mold layer 83. The semiconductor package 11 may be dually molded by the back mold layer 211 and the outer mold layer 83 molding the back mold layer 211.

FIGS. 5A to 5E are cross sectional views illustrating a method for fabricating a semiconductor package according to exemplary embodiments of the present inventive concepts. For concise description, previously described elements may be identified by similar or identical reference numbers without repeating overlapping descriptions thereof.

Figure 5A:
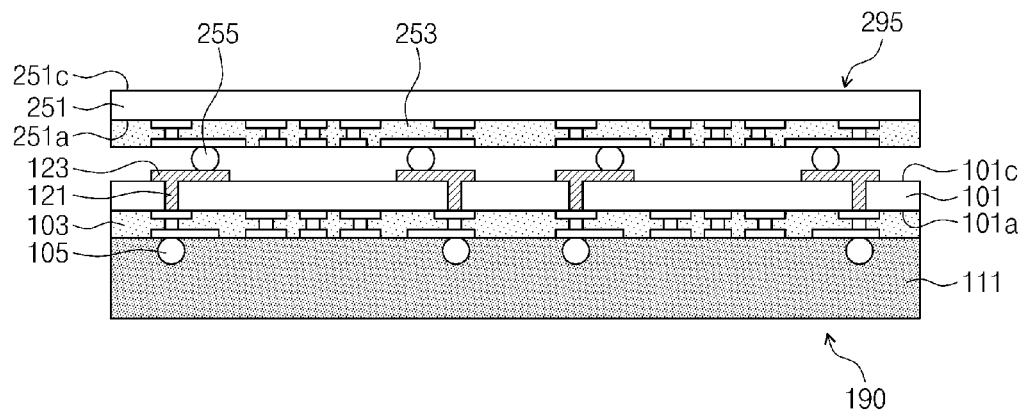
FIGS. 5A to 5E are cross sectional views illustrating a method for fabricating a semiconductor package according to exemplary embodiments.

Referring to FIG. 5A, an upper wafer-level package 295 may be stacked on the wafer-level package 190. For example, identical or similar to the descriptions with reference to FIGS. 1A to 1C, the front mold layer 111 may be formed on the active surface 101a of the wafer 101, the wafer 101 may be grinded, and then the through electrode 121 and the back pad 123 may be formed. A wafer 251 (referred to as an upper wafer) having a circuit layer 253 may be stacked on the inactive surface 101c of the wafer 101 (referred to as lower wafer). The upper wafer 251 may comprise a semiconductor substrate (e.g., silicon substrate) having an active surface 251a and an inactive surface 251c. At least one bump 255 may be provided on the active surface 251a of the upper wafer 251 to be electrically connected to the circuit layer 253. The upper wafer 251 may be stacked on the lower wafer 101 in a state that the active surface 251a of the upper wafer 251 faces the inactive surface 101c of the lower wafer 101.

Figure 5B:
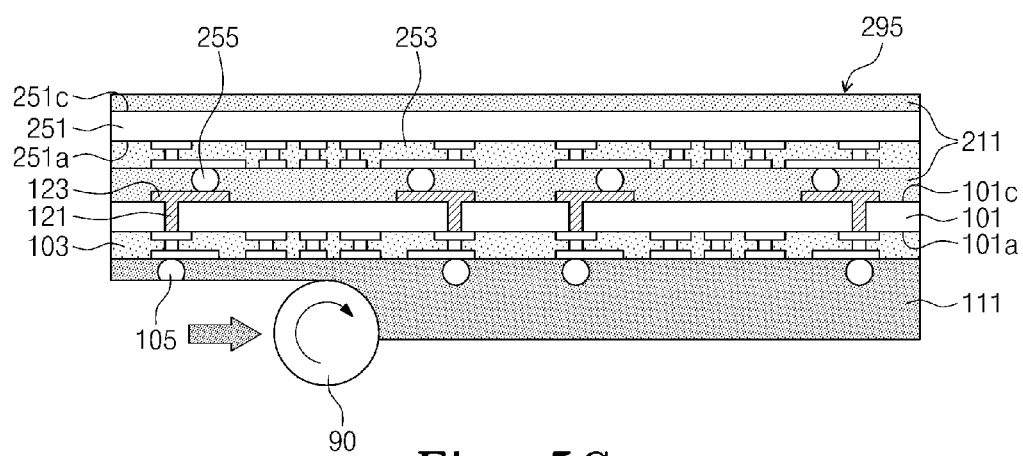

Referring to FIG. 5B, the back mold layer 211 may be formed on the inactive surface 101c of the lower wafer 101 so as to encapsulate the upper wafer-level chip 295 and then the front mold layer 111 may be removed. The front mold layer 111 may be grinded by the grinder 90 until the bump 105 is exposed. Alternatively, the front mold layer 111 may be completely removed using chemical, as illustrated in FIG. 2A. Differently, the front mold layer 111 may remain on the active surface 101a of the lower wafer 101, as illustrated in FIG. 2B.

Figure 5C:
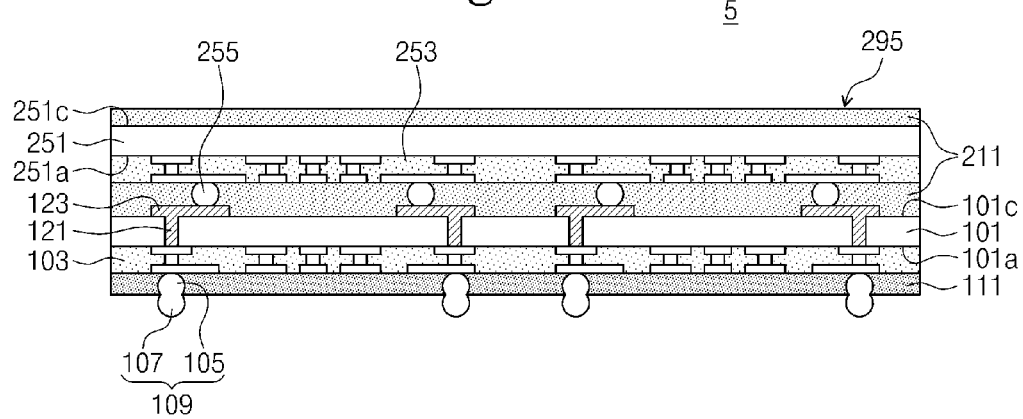

Referring to FIG. 5C, the second bump 107 may be attached to the bump 105 to form the external terminal 109. Through the processes mentioned above, there may be fabricated a wafer-level package 5 including the upper wafer-level chip 295 molded by the back mold layer 211 and stacked on the wafer-level chip 190.

Figure 5D:
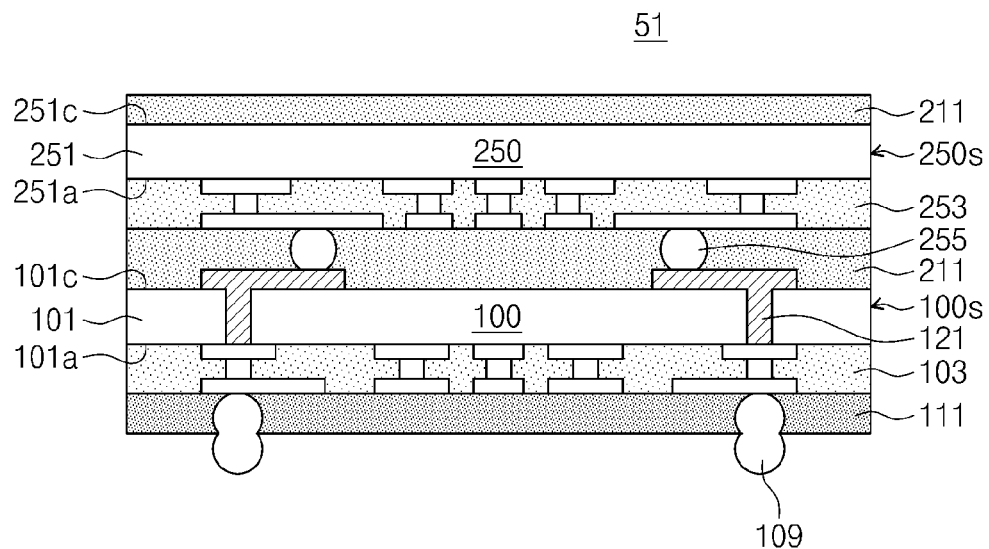

Referring to FIG. 5D, a dicing process may be performed on the wafer-level package 5 to fabricate a semiconductor package 51 including a slave chip 250 formed from the divided upper wafer 251, mounted on the master chip 100. The lateral sides 100s of the master chip 100 may be exposed and lateral sides 250s of the slave chip 250 may be also exposed.

Figure 5E:
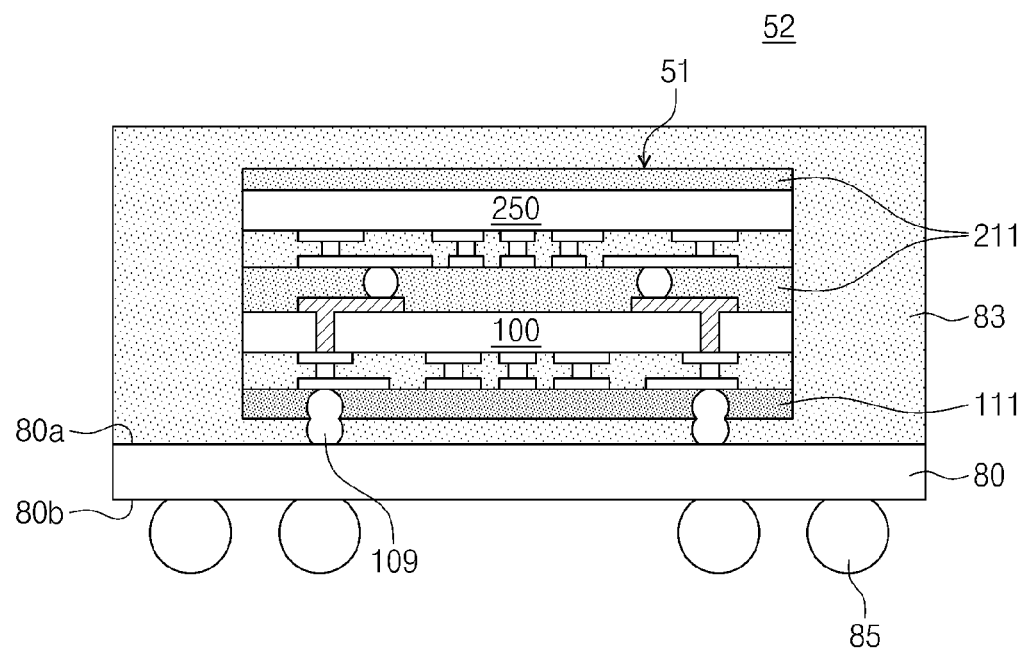

Referring to FIG. 5E, the semiconductor package 51 may be mounted on the front surface 80a of the package substrate 80 (e.g., printed circuit board) and the outer mold layer 83 may be formed to encapsulate the semiconductor package 51, which fabricates a semiconductor package 52. The master chip 100 may be encapsulated by the front mold layer 111, the back mold layer 211 and the outer mold layer 83. The slave chip 250 may be surrounded by the back mold layer 211 and the outer mold layer 83.

FIGS. 6A to 6D are cross sectional views illustrating a method for fabricating a semiconductor package according to exemplary embodiments of the present inventive concepts. For concise description, previously described elements may be identified by similar or identical reference numbers without repeating overlapping descriptions thereof.

Figure 6A:
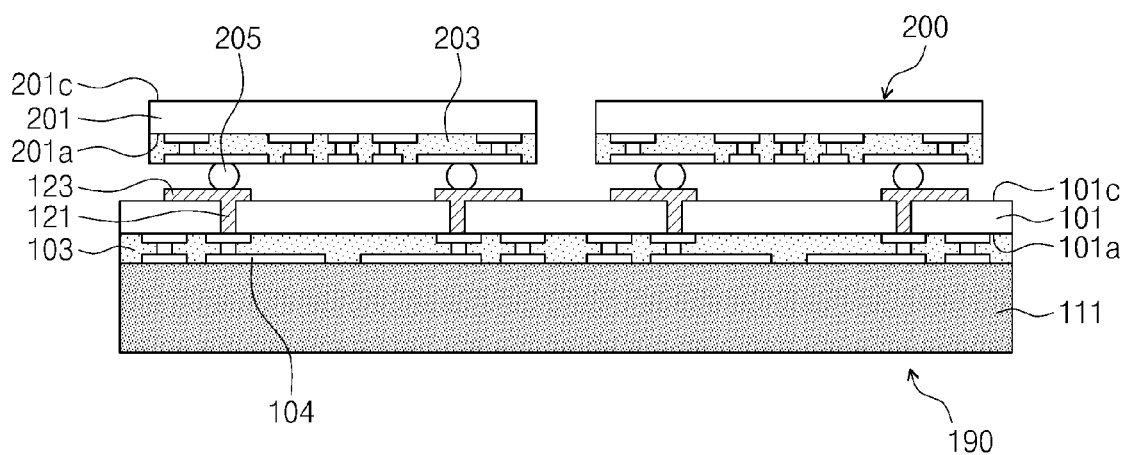
FIGS. 6A to 6D are cross sectional views illustrating a method for fabricating a semiconductor package according to exemplary embodiments.

Referring to FIG. 6A, the plurality of chips 200 may be stacked on the wafer-level chip 190. For example, identical or similar to the descriptions with reference to FIGS. 1A to 1E, the front mold layer 111 may be formed on the active surface 101a of the wafer 101 and then the wafer 101 may be grinded, and thereafter the through electrode 121 and the back pad 123 may be formed and then the plurality of chips 200 may be mounted on the inactive surface 101c of the wafer 101. In some embodiments, the wafer-level chip 190 may not comprise a bump which is provided on the active surfaced 101a of the wafer 101 to be electrically connected on the front pad 104.

Figure 6B:
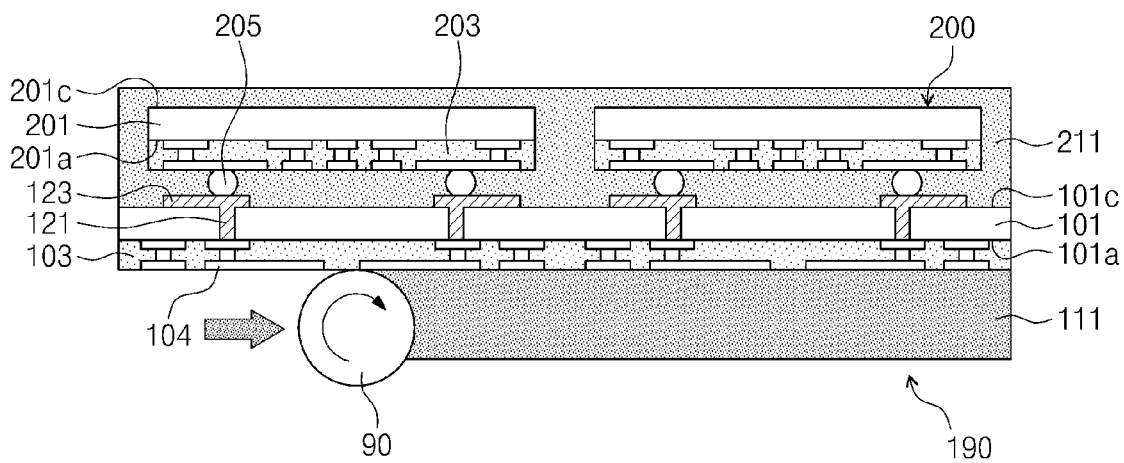

Referring to FIG. 6B, the back mold layer 211 may be formed on the wafer-level chip 190 and then the front mold layer 111 may be removed by a grinding process, a chemical mechanical polishing process or an etching process. In some embodiments, the front mold layer 111 may be grinded by the grinder 90 until the front pad 104 is exposed.

Figure 6C:
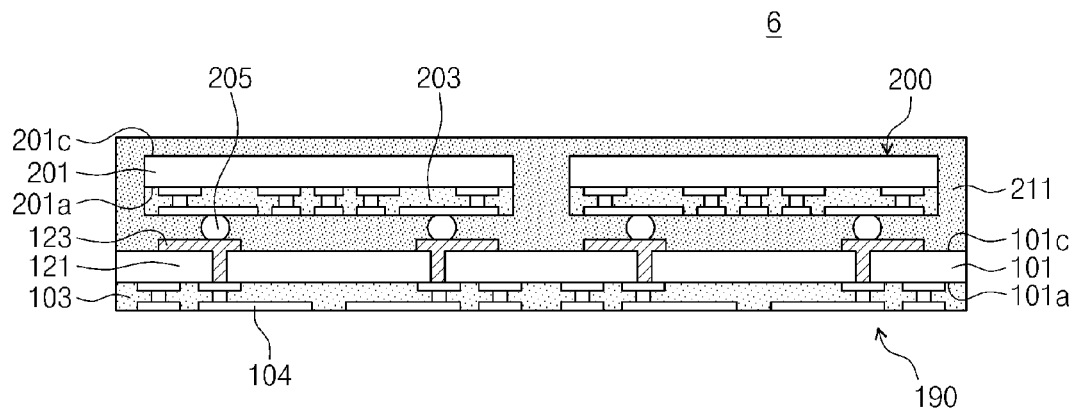

Referring to FIG. 6C, the removal of the front mold layer 111 may fabricate a wafer-level package 6 including the plurality of chips 200 stacked on the wafer-level chip 190. The bump 205 may be coupled to the through electrode 121 such that the chips 200 may be electrically connected to the wafer-level chip 190.

Figure 6D:
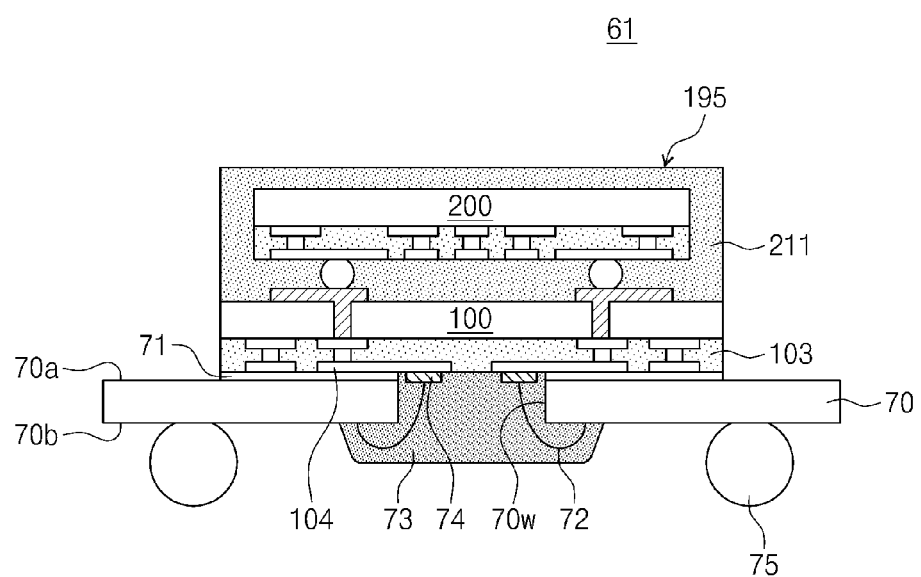

Referring to FIG. 6D, a dicing process may be performed on the wafer-level package 6 to form a plurality of chip stacks 195. The chip stack 195 may be mounted on a package substrate 70 (e.g., printed circuit board) to fabricate a semiconductor package 61. For example, a bonding pad 74 may be formed to be coupled to the front pad 104 and the chip stack 195 may be mounted on a front surface 70a of the package substrate 70. An adhesive layer 71 may be interposed between the chip stack 195 and the package substrate 70. The chip stack 195 may comprise the slave chip 200 stacked in the flip-chip manner on the master chip 100 formed from the divided wafer 101.

At least one solder ball 75 may be attached to a back surface 70b of the package substrate 70. In some embodiments, the package substrate 70 may comprise a window 70w that opens a center portion of the chip stack 195. The chip stack 195 may be electrically connected to the package substrate 70 by a bonding wire 72 passing through the window 70w to be coupled to the bonding pad 74. The window 70w may be filled with a mold layer 73 that encapsulates the bonding wire 72. The bonding wire 72 may be settled and protected by the mold layer 73.

Figure 7A:
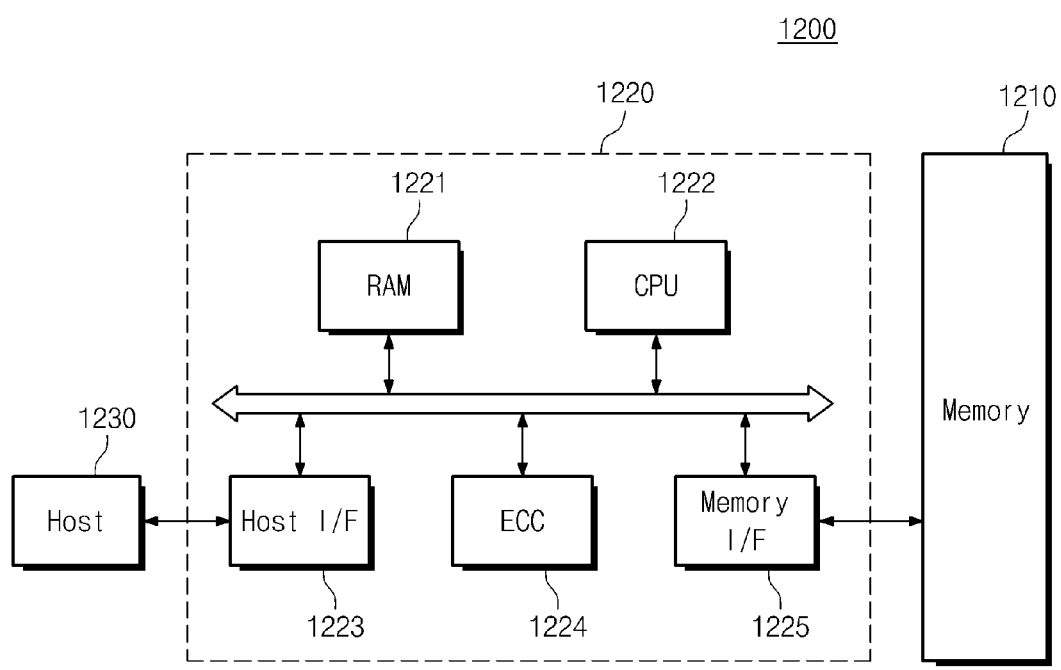
FIG. 7A is a schematic block diagram illustrating an example of memory cards including a semiconductor device according to exemplary embodiments.
Figure 7B:
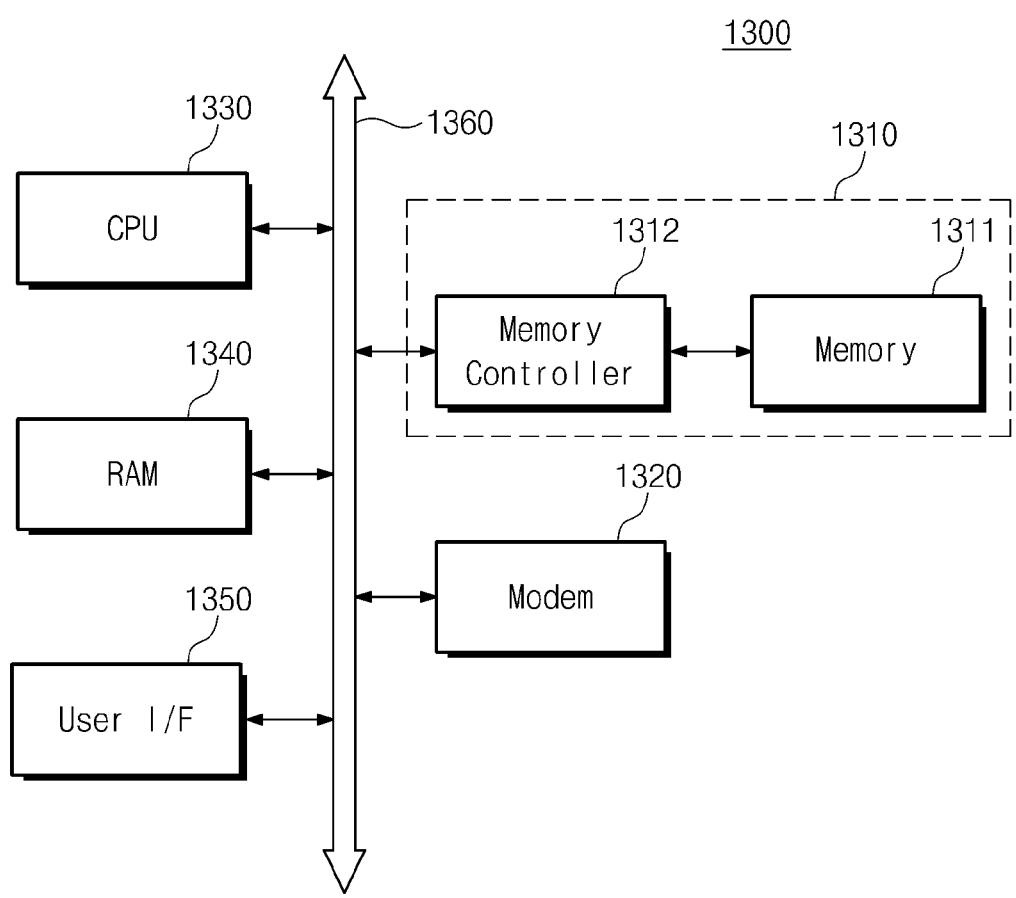
FIG. 7B is a schematic block diagram illustrating an example of information process system including a semiconductor device according to exemplary embodiments.

FIG. 7A is a schematic block diagram illustrating an example of memory cards including a semiconductor package according to exemplary embodiments of the present inventive concepts. FIG. 7B is a schematic block diagram illustrating an example of information process system including a semiconductor package according to exemplary embodiments of the present inventive concepts.

Referring to FIG. 7A, a semiconductor memory 1210 including the semiconductor device 1 according to exemplary embodiments of the inventive concepts is applicable to a memory card 1200. For example, the memory card 1200 may include a memory controller 1220 generally controlling data exchange between a host 1230 and the flash memory device 1210. An SRAM 1221 is used as a work memory of a processing unit 1222. A host interface 1223 has a data exchange protocol of a host connected to the memory card 1200. An error correction coding block 1224 detects and corrects errors of data that are read from the multi-bit flash memory device 1210. A memory interface 1225 interfaces the semiconductor memory device 1210 according to the example embodiments. The processing unit 1222 generally controls data exchange of the memory controller 1220. The memory 1210 may comprise at least one of the semiconductor packages according to exemplary embodiments of the inventive concepts.

Referring to FIG. 7B, an information processing system 1300 may include a memory system 1310 having at least one of the semiconductor packages according exemplary embodiments of the inventive concepts. The information processing system 1300 includes a mobile device or a computer. For example, the information processing system 1300 may include a modem 1320, a central processing unit 1330, a RAM 1340, and a user interface 1350 electrically connected to the memory system 1310 via a system bus 1360. The memory 1310 may include a memory 1311 and a memory controller 1312 and have substantially the same configuration as that of the memory card 1200 in FIG. 7A. The memory system 1310 stores data processed by the central processing unit 1330 or data input from the outside. The information process system 1300 may be provided as a memory card, a solid state disk, a semiconductor device disk, a camera image sensor, and other application chipsets. In some embodiments, the memory system 1310 may be used as a portion of a solid state drive (SSD), and in this case, the information processing system 1300 may stably and reliably store a large amount of data in the memory system 1310.

According to embodiments of the present invention, attaching and detaching of carrier are not needed when the wafer grinding process is performed, so that productivity is raised and process cost is reduced. Because the mold layer has a coefficient of temperature expansion (CTE) similar to that of the wafer, warpage of the wafer can be prevented or reduced and process inferiority can be suppressed. The present invention is compatible with any one of Via First, Via Middle and Via Last.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of making a semiconductor device, the method comprising:
   providing a substrate including a first active layer on a front surface of a wafer;
   forming a first mold layer on the first active layer to provide rigidity to the substrate, the first mold layer including a polymer material;
   thinning the substrate by removing a first back surface of the substrate after forming the first mold layer, to expose a second back surface, the substrate being held in place during the thinning by attaching the first mold layer to a device without using an adhesive; and
   forming pads on the thinned substrate, the pads being electrically connected to through electrodes in the substrate,
   wherein the first mold layer has a predetermined thickness to provide rigidity to the substrate such that the substrate does not bend while the substrate is being thinned.

2. The method of claim 1, wherein the device is attached to the first mold layer without bonding the device to the first mold layer.

3. The method of claim 1, wherein the device is attached to the first mold layer without using an adhesive between the device and the first mold layer.

4. The method of claim 1, wherein the thinning the first back surface of the substrate comprises removing the first back surface using a mechanical process.

5. The method of claim 1, wherein the thinning the first back surface of the substrate comprises grinding the first back surface of the substrate.

6. The method of claim 4 further comprising forming the through electrodes in the thinned substrate.

7. The method of claim 6 further comprising:
   stacking a chip on the second back surface of the thinned substrate, an active layer of the chip facing the second back surface of the thinned substrate.

8. The method of claim 7 further comprising:
   forming a second mold layer on the chip to encapsulate the chip to provide rigidity to the substrate; and
   removing at least a portion of the first mold layer after forming the second mold layer to form a smooth planar surface.

9. The method of claim 8 further comprising:
cutting the first and the second mold layers and the substrate to form a semiconductor package so that any one of a width of the first mold layer of the semiconductor package and a width of the second mold layer of the semiconductor package, and a width of the substrate of the semiconductor package is substantially greater than a width of the chip.

10. The method of claim 9, wherein the width of the first mold layer of the semiconductor package, the width of the second mold layer of the semiconductor package, and the width of the substrate of the semiconductor package are substantially same.

11. The method of claim 9, wherein the second mold layer is not disposed between the chip and the substrate.

12. The method of claim 1, wherein in the thinning the substrate, the device is a vacuum chuck which directly holds and is in direct contact with the first mold layer.

13. The method of claim 8, wherein in the removing at least a portion of the first mold layer, the second mold layer is directly held by and is in direct contact with a vacuum chuck.

14. The method of claim 1, wherein a coefficient of thermal expansion (CTE) of the first mold layer and a CTE of the substrate are within an order of magnitude.

15. The method of claim 1, wherein a ratio of the coefficient of thermal expansion (CTE) of the first mold layer and a CTE of the substrate is in a range from 3 to 1.

16. The method of claim 1, wherein the first active layer is a circuit layer.

17. A method of making a semiconductor device, the method comprising:
providing a substrate including a first active layer on a front surface of a wafer;
forming a first mold layer on the first active layer to provide rigidity to the substrate, the first mold layer including a polymer material;
thinning the substrate by removing a first back surface of the substrate after forming the first mold layer, to expose a second back surface;
forming through electrodes in the thinned substrate, the through electrodes being electrically connected to the first active layer; and
forming pads on the thinned substrate, the pads being electrically connected to the through electrodes in the substrate,
wherein a coefficient of thermal expansion (CTE) of the first mold layer and a CTE of the substrate are within an order of magnitude.

18. The method of claim 17, wherein the first mold layer is attached to a device without bonding the device to the first mold layer.

19. The method of claim 17, wherein the first mold layer is attached to a device without using an adhesive between the device and the first mold layer.

20. The method of claim 17, wherein the thinning the first back surface of the substrate comprises removing the first back surface using a mechanical process.

21. The method of claim 17, wherein the thinning the first back surface of the substrate comprises grinding the first back surface of the substrate.

22. The method of claim 20 further comprising:
stacking a chip on the second back surface of the thinned substrate, an active layer of the chip facing the second back surface of the thinned substrate.

23. The method of claim 22 further comprising:
forming a second mold layer on the chip to encapsulate the chip to provide rigidity to the substrate; and
removing at least a portion of the first mold layer after forming the second mold layer to form a smooth planar surface.

24. The method of claim 23 further comprising:
cutting the first and the second mold layers and the substrate to form a semiconductor package so that any one of a width of the first mold layer of the semiconductor package and a width of the second mold layer of the semiconductor package, and a width of the substrate of the semiconductor package is substantially greater than a width of the chip.

25. The method of claim 23, wherein the width of the first mold layer of the semiconductor package, the width of the second mold layer of the semiconductor package, and the width of the substrate of the semiconductor package are substantially same.

26. The method of claim 23, wherein the second mold layer is not disposed between the chip and the substrate.

27. The method of claim 18, wherein in the thinning the substrate, the device is a vacuum chuck which directly holds and is in direct contact with the first mold layer.

28. The method of claim 23, wherein in the removing at least a portion of the first mold layer, the second mold layer is directly held by and is in direct contact with a vacuum chuck.

29. The method of claim 17, wherein a ratio of the coefficient of thermal expansion (CTE) of the first mold layer and a CTE of the substrate is in a range from 3 to 1.

30. A method of manufacturing a semiconductor device, the method comprising:
providing a substrate including a first active layer on a front surface; and
forming a first mold layer on the first active layer to provide rigidity to the substrate;
thinning the substrate by removing a first back surface of the substrate after forming the first mold layer, to expose a second back surface;
forming through electrodes in the thinned substrate, the through electrodes being electrically connected to the first active layer;
forming pads on the thinned substrate, the pads being electrically connected to the through electrodes in the substrate; and
stacking a chip on the second back surface of the thinned substrate, an active layer of the chip facing the second back surface of the thinned substrate,
wherein the substrate is held in place by attaching the first mold layer to a device without using an adhesive when the substrate is being thinned, and
a width of the first mold layer and a width of the substrate are substantially same.

* * * * *